(12) United States Patent
Im

(10) Patent No.: US 11,747,871 B2
(45) Date of Patent: Sep. 5, 2023

(54) FLEXIBLE PRINTED CIRCUIT BOARD AND DISPLAY DEVICE INCLUDING THE SAME

(71) Applicant: SAMSUNG DISPLAY CO., LTD., Yongin-si (KR)

(72) Inventor: Dae Hyuk Im, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 188 days.

(21) Appl. No.: 17/407,460

(22) Filed: Aug. 20, 2021

(65) Prior Publication Data
US 2022/0075430 A1 Mar. 10, 2022

(30) Foreign Application Priority Data

Sep. 8, 2020 (KR) .................. 10-2020-0114387

(51) Int. Cl.
*H05K 1/18* (2006.01)
*G06F 1/18* (2006.01)
*H05K 1/11* (2006.01)

(52) U.S. Cl.
CPC .............. *G06F 1/183* (2013.01); *G06F 1/189* (2013.01); *H05K 1/111* (2013.01); *H05K 1/118* (2013.01); *H05K 2201/10128* (2013.01)

(58) Field of Classification Search
CPC ......... G06F 1/183; G06F 1/189; H05K 1/111; H05K 1/118; H05K 2201/10128

USPC ......................................................... 361/748
See application file for complete search history.

(56) References Cited

U.S. PATENT DOCUMENTS

2016/0071818 A1* 3/2016 Wang .................. H01L 24/49
257/773
2017/0125359 A1* 5/2017 Sakai .................... H01L 25/117

FOREIGN PATENT DOCUMENTS

| CN | 208400096 | 1/2019 |
|---|---|---|
| KR | 10-2002-0029623 | 4/2002 |
| KR | 10-2003-0074429 | 9/2003 |
| KR | 10-2005-0015422 | 2/2005 |
| KR | 10-0722629 | 5/2007 |

* cited by examiner

*Primary Examiner* — Binh B Tran
(74) *Attorney, Agent, or Firm* — F. Chau & Associates, LLC

(57) ABSTRACT

A flexible printed circuit board and a display device including the same are provided. An embodiment of a display device includes a display panel; a first circuit board attached to a first side of the display panel in a first direction; and a second circuit board attached to a second side of the first circuit board in the first direction, wherein the first circuit board includes a first bump area overlapping the display panel and a second bump area overlapping the second circuit board, the first bump area includes a plurality of first divided board portions arranged along a second direction crossing the first direction, and the first divided board portions of the plurality of first divided board portions partially overlap each other.

20 Claims, 25 Drawing Sheets

FLEXIBLE PRINTED CIRCUIT BOARD AND DISPLAY DEVICE INCLUDING THE SAME

CROSS-REFERENCE TO RELATED APPLICATION

This application claims priority under 35 U.S.C. § 119 to Korean Patent Application No. 10-2020-0114387 filed on Sep. 8, 2020 in the Korean Intellectual Property Office, the disclosure of which is incorporated by reference herein in its entirety.

TECHNICAL FIELD

The present disclosure relates to a flexible printed circuit board and a display device including the same.

DISCUSSION OF THE RELATED ART

The demand for display devices has steadily increased with the development of multimedia technology. Accordingly, various types of display devices such as liquid crystal display (LCD) devices, organic light emitting display (OLED) devices and the like have been used.

A typical display device may include a substrate partitioned into a display area and a non-display area. The non-display area typically surrounds or is disposed on at least one side of the display area. The display device may have a plurality of pixels disposed on the substrate in the display area, and a plurality of pads and the like disposed on the substrate in the non-display area. A flexible film that includes a driving circuit and the like can be coupled to the plurality of pads to transmit a driving signal to the pixels.

The flexible film may include a plurality of bumps coupled to the plurality of pads. For example, the bumps may be bonded to the pads.

SUMMARY

Aspects of the present disclosure provide a flexible circuit board capable of minimizing stretching of a first circuit board that occurs during thermo-compression bonding and a display device including the same.

An embodiment of a display device includes a display panel; a first circuit board attached to one side of the display panel in a first direction; and a second circuit board attached to one side of the first circuit board in the first direction, wherein the first circuit board includes a first bump area overlapping the display panel and a second bump area overlapping the second circuit board, the first bump area includes a plurality of first divided board portions arranged along a second direction crossing the first direction, and the plurality of first divided board portions partially overlap each other.

An embodiment of a flexible printed circuit board includes a board; a plurality of first bumps disposed on one side of the board in a first direction; and a plurality of second bumps disposed on the opposite side of the board in the first direction, wherein the board includes a first bump area in which the first humps are disposed and a second bump area in which the second bumps are disposed, the first bump area includes a plurality of first divided board portions arranged along a second direction crossing the first direction, and the plurality of first divided board portions partially overlap each other.

In accordance with the flexible circuit board according to an embodiment and the display device including the same, stretching of the first circuit board that occurs during thermo-compression bonding may be minimized. By minimizing the stretching of the first circuit board, it is possible to minimize an alignment error between a bump of the first circuit board and a pad of the display panel and a pad of a second circuit board.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

The present inventive concepts will now be described more fully hereinafter with reference to the accompanying drawings, in which embodiments of the inventive concepts are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The same reference numbers may indicate the same components throughout the specification.

Hereinafter, embodiments of the present inventive concepts will be described in detail with reference to the accompanying drawings.

Figure 1:
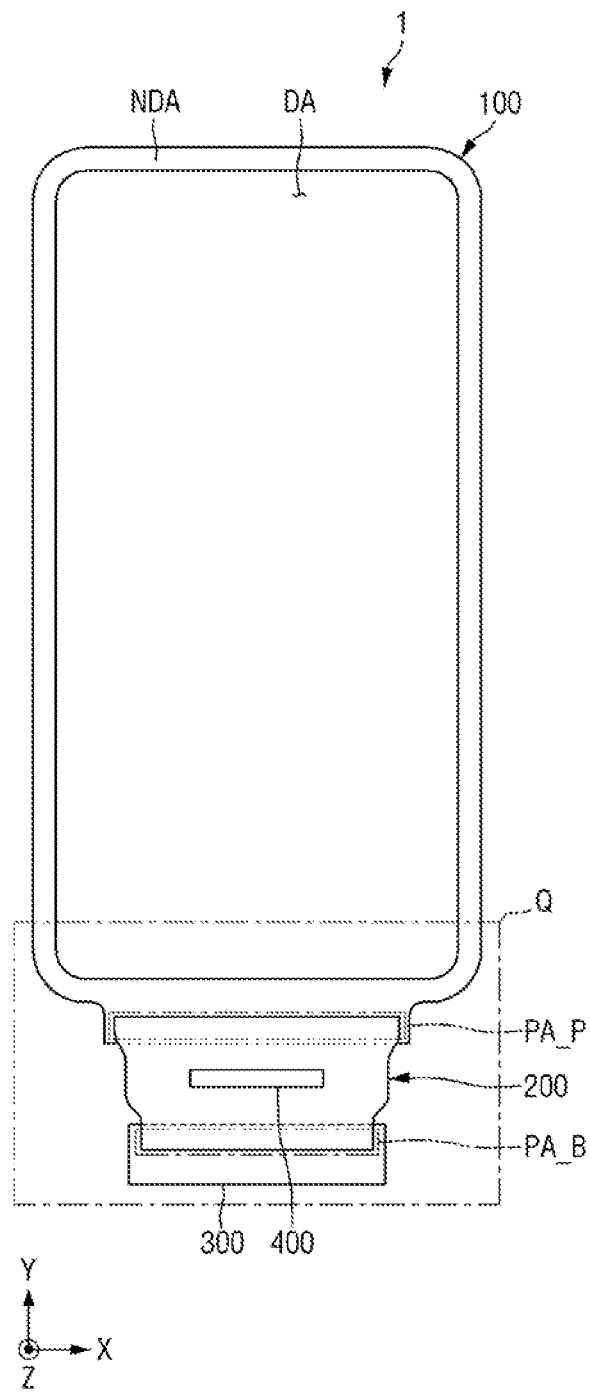
FIG. 1 is a plan view of a display device according to an embodiment.

FIG. 1 is a plan view of a display device according to an embodiment.

A display device is a device configured to display a moving image or a still image. The display device may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems, ultra mobile PCs (UMPCs), and the like.

Referring to FIG. 1, the display device 1 may include a display area DA configured to display an image and a non-display area NDA disposed around the display area DA. The display area DA may have a rectangular shape with right-angled or rounded corners in plan view. The planar shape of the display area DA is not limited to a rectangular shape, but may have a circular shape, an elliptical shape, or various other shapes.

The non-display area NDA may be disposed around the display area DA. The non-display area NDA may be disposed adjacent to both short sides of the display area DA. The non-display area NDA may be disposed adjacent to both long sides as well as both short sides of the display area DA. That is, the non-display area NDA may be disposed to surround the peripheral sides of the display area DA and form edges of the display area DA.

The display device 1 may include a display panel 100 configured to display an image, a first circuit board 200 attached to an end of the display panel 100 in a second direction Y, a second circuit board 300 attached to an end of the first circuit board 200 in the second direction Y, and a driving chip 400 disposed on the first circuit board 200. In one embodiment, a data driving integrated circuit used to drive the display device 1 may be implemented by the driving chip 400 and attached to a plastic substrate or a glass substrate by a chip on plastic (COP) method or a chip on glass (COG) method. In the following description, a case where a chip on film (COF) method in which the driving chip 400 is attached to the display panel 100 through a flexible film is applied will be described.

The display panel 100 may be, for example, an organic light emitting display panel. In the following embodiments, a case where an organic light emitting display panel is applied to the display panel 100 will be described, but the present disclosure is not limited thereto, and other types of display panels such as a liquid crystal display panel, a quantum nano light emitting display panel, a micro LED display panel, a field emission display panel, an electrophoretic display panel, and the like may be applied.

The display panel 100 may include a plurality of pixels disposed in the display area DA. The display panel 100 may further include a first pad area PA_P disposed in the non-display area NDA. The first pad area PA_P may be disposed near one side of the display area DA in the non-display area NDA. For example, as shown in FIG. 1, the first pad area PA_P may be disposed adjacent to another side of the display area DA in the second direction Y. The width of the non-display area NDA where the first pad area PA_P is disposed may be greater than the width of a region of the non-display area NDA where the first pad area PA_P is not disposed.

Figure 2:
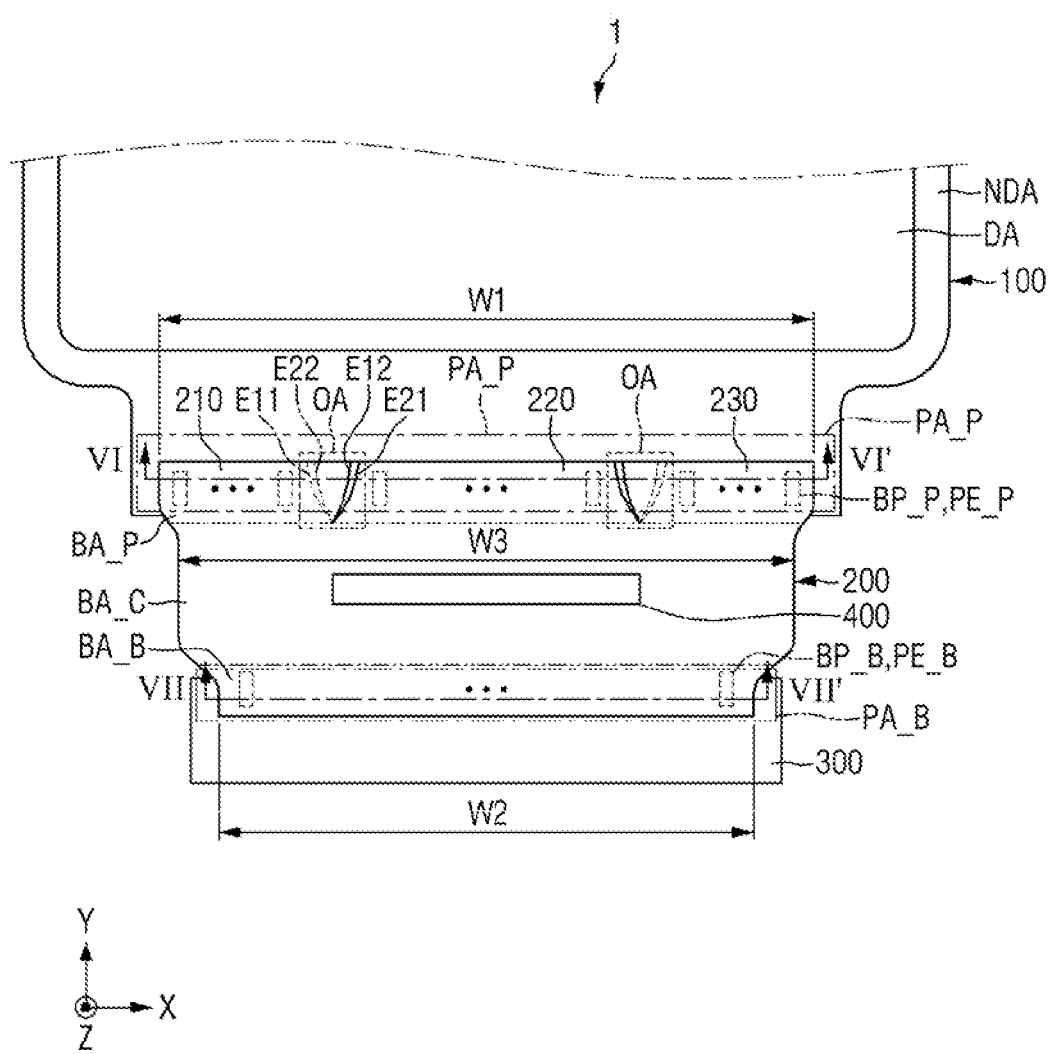
FIG. 2 is an enlarged view of area Q of FIG. 1.
Figure 3:
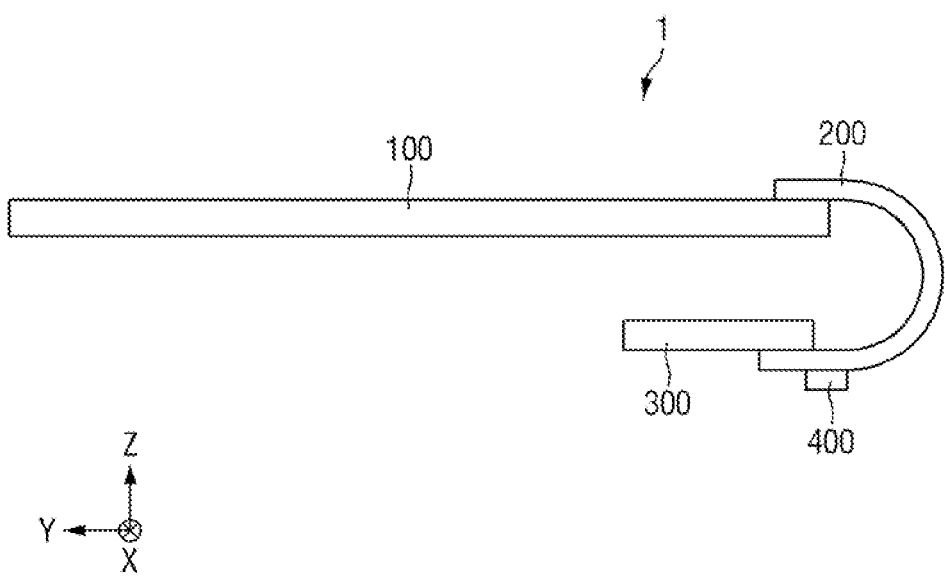
FIG. 3 is a side view of a display device according to an embodiment.
Figure 4:
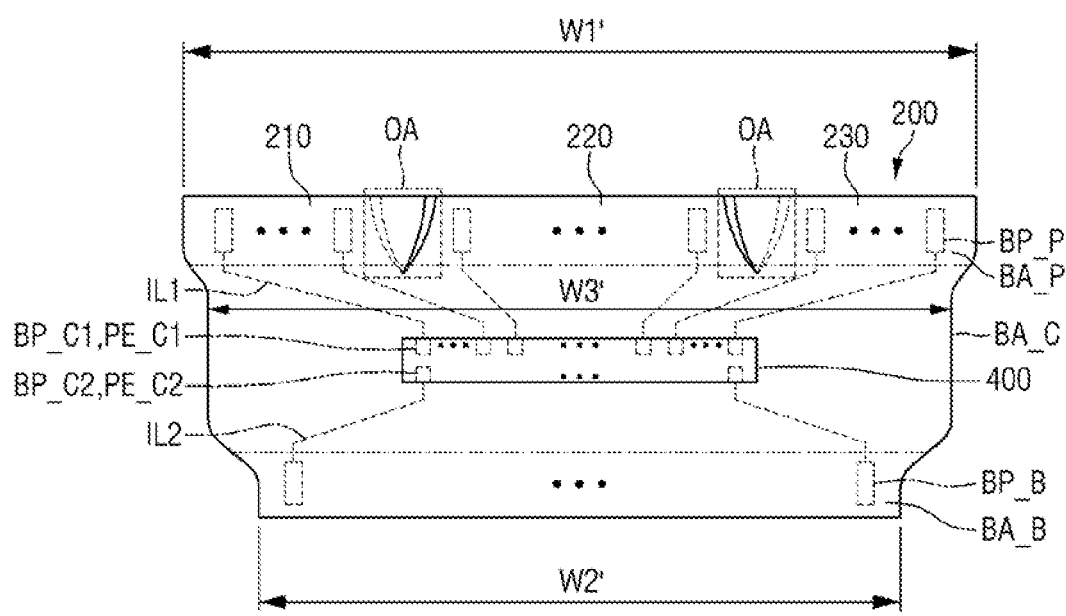
FIG. 4 is a plan view illustrating a front surface of a first circuit board according to an embodiment.
Figure 5:
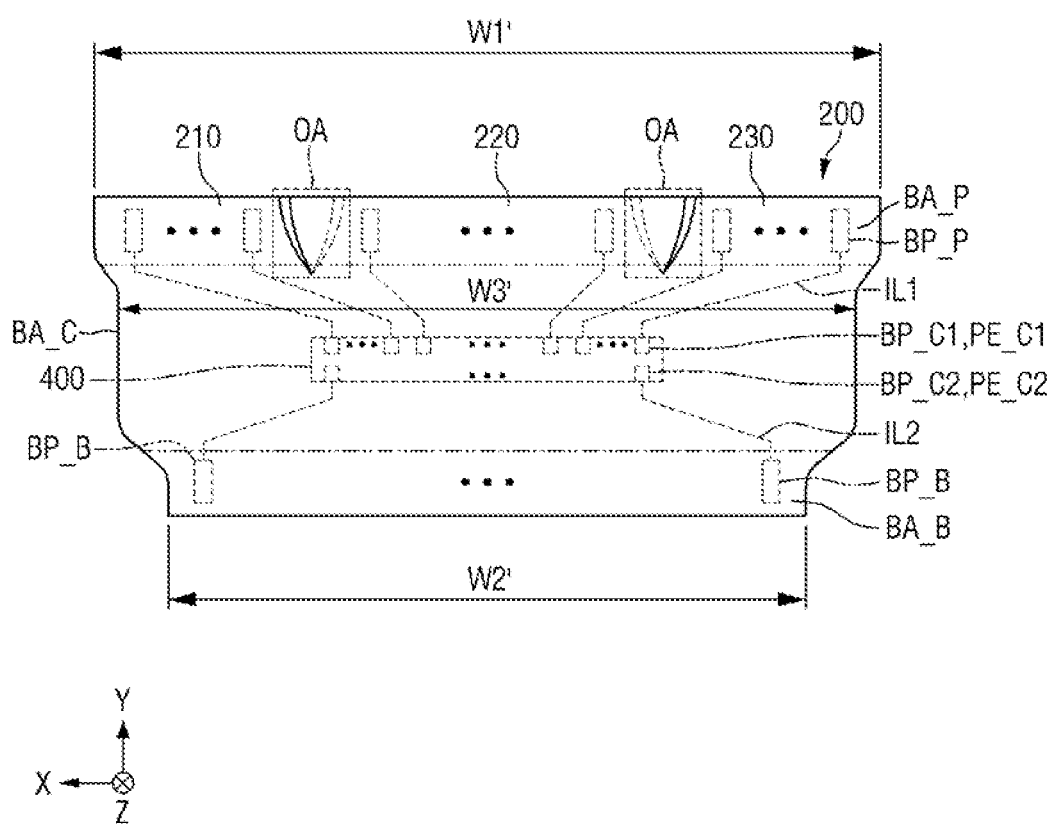
FIG. 5 is a plan view illustrating a rear surface of a first circuit board according to an embodiment.

FIG. 2 is an enlarged view of area Q of FIG. 1. FIG. 3 is a side view of a display device according to an embodiment. FIG. 4 is a plan view illustrating a front surface of a first circuit board according to an embodiment. FIG. 5 is a plan view illustrating a rear surface of a first circuit board according to an embodiment.

Referring to FIGS. 2 to 5, a plurality of first pads PE_P may be disposed in the first pad area PA_P. The plurality of first pads PE_P may be arranged in one direction. For example, the plurality of first pads PE_P may be arranged in a first direction X. Although FIG. 2 illustrates that the first pad area PA_P includes the plurality of first pads PE_P forming one row, the present disclosure is not necessarily limited thereto and the first pad areas PA_P may include a plurality of first pads PE_P forming two or more rows spaced apart from each other in the second direction Y. Each first pad PE_P may be connected to a line extending from the display area DA. Further, each first pad PE_P may be electrically connected to the driving chip 400 to be described later. The first pad PE_P may be made of one of copper (Cu), tin (Sn), gold (Au), nickel (Ni), or the like, and may be formed as a single layer or a multilayer.

In one embodiment, the first circuit board 200 may be attached to the first pad area PA_P of the display panel 100. Specifically, one end portion of the first circuit board 200 in the second direction Y may be attached to the first pad area PA_P of the display panel 100.

The first circuit board 200 may include a first bump area BA_P located at one side in the second direction Y, a second bump area BA_B located at the other side of the first circuit board 200 in the second direction Y, and a third bump area BA_C located between the first bump area BA_P and the second bump area BA_B. In an example embodiment, the first bump area BA_P may partially or substantially overlap the first pad area PA_P in a third direction Z.

The first circuit board 200 may include a flexible board containing a flexible material. For example, the first circuit board 200 may include at least one of polyethylene terephthalate (PET), polyimide (PI), polycarbonate (PC), polyethylene (PE), polypropylene (PP), polysulfone (PSF), polymethylmethacrylate (PMMA), triacetylcellulose (TAC) or cycloolefin polymer (COP).

The driving chip 400 may be disposed on one surface of the first circuit board 200. In one embodiment, the driving chip 400 may be disposed in the center of the first circuit board 200. The driving chip 400 may receive an image signal applied from the second circuit board 300 to be described later, convert it to a data signal in the form of an analog voltage, and transmit the data signal to a pixel. The arrangement structure of the driving chip 400 will be described later.

The first bump area BA_P may be located at one end of the first circuit board 200 in the second direction Y. A plurality of first bumps BP_P may be arranged in the first bump area BA_P. The first bumps BP_P may be arranged in one row in one direction. For example, the first bumps BP_P may be arranged side by side in the first direction X. Although it is illustrated in the drawing that the first bumps BP_P are arranged in one row, the present disclosure is not necessarily limited thereto and the first bumps BP_P may be arranged in multiple rows.

Each first bump BP_P of the first circuit board 200 may be bonded and electrically connected to each first pad PE_P of the display panel 100. In one embodiment, the first bump BP_P and the first pad PE_P may be bonded to each other by a first adhesive layer ACF1 disposed therebetween. Bonding through the first adhesive layer ACF1 may be performed by thermo-compression bonding. In another embodiment, the first bump BP_P of the first circuit board 200 may be directly bonded to the first pad PE_P without another layer or another component interposed therebetween. Such direct bonding may be performed by ultrasonic bonding, but the present disclosure is not necessarily limited thereto.

The width of each first bump BP_P may be smaller than the width of each first pad PE_P. However, the present disclosure is not necessarily limited thereto, and the width of the first bump BP_P may be greater than or equal to the width of the first pad PE_P.

The first bump BP_P may be made of a material that can easily bond to the first pad PE_P. For example, the first bump BP_P may be made of one or more materials among gold (Au), nickel (Ni), tin (Sn), or the like. The first bump BP_P may have a single layer structure or a stacked structure.

The first circuit board 200 may include a plurality of divided board portions 210, 220, and 230 arranged in the first bump area BA_P. Although FIGS. 2, 4 and 5 show that the first circuit board 200 is divided into three portions and includes the first to third divided board portions 210, 220, and 230, the number of the divided portions is not necessarily limited thereto. The plurality of first bumps BP_P may be arranged in each of the first to third divided board portions 210, 220, and 230. The first to third divided board portions 210, 220, and 230 may be arranged along the first direction X.

The first bump area BA_P lay include an overlapping area OA where the first and second divided board portions 210 and 220 overlap each other and an overlapping area OA where the second and third divided board portions 220 and 230 overlap each other. The amount of stretching of the first bump area BA_P of the first circuit board 200 during thermo-compression bonding may be reduced due to the overlapping areas OA where the first to third divided board portions 210, 220, and 230 partially overlap. For example, the divided board portions 210, 220, and 230 may be formed of different pieces so as to disperse an amount of stretching therebetween during a thermo-compression bonding process.

The plurality of overlapping areas OA may be spaced apart from each other in the first direction X in the first bump area BA_P. Although FIGS. 2, 4 and 5 show the first bump area BA_P where two overlapping areas OA are arranged, the number of the overlapping areas OA is not necessarily limited thereto. The structure of the overlapping area OA will be described in detail later with reference to FIGS. 6 and 9.

The second bump area BA_B may be located at the other end of the first circuit board 200 in the second direction Y. A plurality of second bumps BP_B may be arranged in the second bump area BA_B. The plurality of second bumps BP_B may be arranged in one row in one direction. For example, the plurality of second bumps BP_B may be arranged side by side in the first direction X. Although it is illustrated in the drawing that the second bumps BP_B are arranged in one row, the present disclosure is not necessarily limited thereto and the second bumps BP_B may be arranged in multiple rows spaced apart from each other in the second direction Y. The size of the second bump BP_B may be greater than the size of the first bump BP_P. Further, the number of the second bumps BP_B may be, but not necessarily, fewer than the number of the first bumps BP_P.

The third bump area BA_C may be located between the first bump area BA_P and the second bump area BA_B. With reference to FIG. 4, a plurality of third bumps BP_C1 and BP_C2 may be arranged in the third bump area BA_C. The third bumps BP_C1 and BP_C2 may be electrically connected to the driving chip 400 to be described later. Specifically, the third bumps BP_C1 and BP_C2 may be electrically connected to third pads PE_C1 and PE_C2 of the driving chip 400.

The first circuit board 200 may be bent in the third direction Z to fold over itself. The bend may be located substantially in the third bump area BA_C. The third bump area BA_C may be bent with a constant radius of curvature. However, the present disclosure is not necessarily limited thereto, and the third bump area BA_C may be bent with a different radius of curvature for each section. The surface of the first circuit board 200 may change orientation as the first circuit board 200 is bent in the third bump area BA_C. In other words, one surface of the first circuit board 200 facing one side in the third direction Z in the first bump area BA_P may orient to face the other side in the second direction Y in the third bump area BA_C and then further orient to face the other side in the third direction Z in the second bump area BA_B.

The second bump area BA_B may extend from the third bump area BA_C. The second bump area BA_B may extend in a direction parallel to the first bump area BA_P from a point where bending is completed. The second bump area BA_B may overlap at least a portion of the first bump area BA_P in the thickness direction of the first circuit board 200. The second bump area BA_B may overlap at least a portion of the non-display area NDA of the display panel 100 that overlaps the first bump area BA_P. The second bump area BA_B may overlap a portion of the display area DA of the display panel 100.

With reference to FIG. 4, the first circuit board 200 may further include a plurality of first lead lines IL1 electrically connecting the plurality of first bumps BP_P to the plurality of third bumps BP_C1 arranged at one side of the circuit board 200 in the second direction Y, and a plurality of lead lines IL2 electrically connecting the plurality of second bumps BP_B to the plurality of third bumps BP_C2 arranged at the other side of the circuit board 200 in the second direction Y. For example, one first bump BP_P and one third bump BP_C1 may be connected by one first lead line IL1. Further, one third bump BP_C2 and one second bump BP_B may be connected by one second lead line IL2.

The first and second lead lines IL1 and IL2 may be formed in the first circuit board 200, but the present disclosure is not necessarily limited thereto.

The first circuit board 200 may have a shape in which the width in the first direction X is substantially reduced from one side toward the other side along the second direction Y.

The first bump area BA_P of the first circuit board 200 that is not attached to the display panel 100 may have a first' width W1' in the first direction X. The first bump area BA_P of the first circuit board 200 attached to the display panel 100 may have a first width W1 in the first direction X. The first width W1 may be greater than the first' width W'. However, the present disclosure is not necessarily limited thereto, and the first width W1 may be substantially the same as the first' width W1'. An attaching process may include a thermo-compression bonding process, and the first bump area BA_P of the first circuit board 200 may be stretched in the first direction X by the attaching process.

The second bump area BA_B of the first circuit board 200 may have a second' width W2' in the first direction X before the second circuit board 300 is attached to it. The second bump area BA_B of the first circuit board 200 may have a second width W2 in the first direction X after the second circuit board 300 is attached to it. The second width W2 may be greater than the second' width W2'. However, the present disclosure is not necessarily limited thereto, and the second width W2 may be the same as the second' width W2°. The attaching process may include the thermo-compression bonding process, and the second bump area BA_B of the first circuit board 200 may be stretched in the first direction X by the attaching process.

The third bump area BA_C of the first circuit board 200 may have a third' width W3' in the first direction X before the attachment of the display panel 100 and the second circuit board 300. The third bump area BA_C is less affected by thermo-compression bonding that occurs during the attaching process. Therefore, the third bump area BA_C of the first circuit board 200 may have a third width W3 in the first direction X after the display panel 100 and the second circuit board 300 are attached. The third width W3 may be substantially the same as the third' width W3'. However, the present disclosure is not necessarily limited thereto, and the third width W3 may be greater than the third' width W3'.

In the first circuit board 200 to which the display panel 100 and the second circuit board 300 are not attached, the first' width W1' may be greater than the third' width W3' and the third' width W3' may be greater than the second' width W2'. The first' width W1' may be uniform from one side toward the other side of the first bump area BA_P along the second direction Y and reduced in the area where the first bump area BA_P is adjacent to the third bump area BA_C. The second' width W2' of the first circuit board 200 may be uniform from one side toward the other side of the second bump area BA_B along the second direction Y and increased in the area where the second bump area BA_B is adjacent to the third bump area BA_C. The third' width W3' of the first circuit board 200 may be substantially reduced from one side toward the other side in the second direction Y. The third' width W3' may be largest in the area where the third bump area BA_C is adjacent to the first bump area BA_P, and may be smallest in the area where the third bump area BA_C is adjacent to the second bump area BA_B.

In the first circuit board 200 to which the display panel 100 and the second circuit board 300 are attached, the first width W1 may be greater than the third width W3 and the third width W3 may be greater than the second width W2. However, the present disclosure is not necessarily limited thereto. The first width W1 of the first circuit board 200 may be uniform from one side toward the other side of the first bump area BA_P in the second direction Y and reduced in the area where the first bump area BA_P is adjacent to the third bump area BA_C. The second width W2 of the first circuit board 200 may be uniform from the other side toward one side of the second bump area BA_B in the second direction Y and increased in the area where the second bump area BA_B is adjacent to the third bump area BA_C. The third width W3 may be generally reduced from one side toward the other side in the second direction Y. The third width W3 may be largest in the area where the third bump area BA_C is adjacent to the first bump area BA_P, and may be smallest in the area where the third bump area BA_C is adjacent to the second bump area BA_B.

The driving chip 400 may be disposed on the third bump area BA_C of the first circuit board 200. The driving chip 400 may include an integrated circuit that drives the first circuit board 200. In one embodiment, the integrated circuit may be, but is not necessarily limited to, a data driving integrated circuit that generates and provides a data signal. The driving chip 400 may be mounted on one surface of the first circuit board 200 that is the same surface as the display surface. Since the orientation of the surface of the first circuit board 200 reverses as it is bent around the third bump area BA_C as described above, the driving chip 400 may be mounted on the surface of the first circuit board 200 facing downward in a thickness direction such that the top surface of the driving chip 400 faces the other side in the third direction Z; for example, the top surface of the driving chip 400 may also face downward in the thickness direction. The driving chip 400 may be attached onto the first circuit board 200 through an adhesive layer or may be directly attached onto the first circuit board 200 by ultrasonic bonding. The width of the driving chip 400 in the first direction X may be less than the width of the first circuit board 200 in the first direction X. The driving chip 400 may be disposed at the center of the third bump area BA_C in the first direction X, and the edges on one side and the other side of the driving chip 400 in the first direction X may be respectively separated from the edges on one side and the other side of the third bump area BA_C in the first direction X.

The second circuit board 300 may be attached to the other end of the first circuit board 200 in the second direction Y. The second circuit board 300 may include the plurality of second pads PE_B respectively electrically connected to the plurality of second bumps BP_B of the first circuit board 200.

The second circuit board 300 may be a rigid substrate including a material such as glass or quartz, but is not necessarily limited thereto, and the second circuit board 300 may be a flexible substrate including a flexible material. For example, the second circuit board 300 may include at least one of polyethylene terephthalate (PET), polyimide (PI), polycarbonate (PC), polyethylene (PE), polypropylene (PP), polysulfone (PSF), polymethylmethacrylate (PMMA), triacetylcellulose (TAC) or cycloolefin polymer (COP).

The second pad area PA_B may be located at one end of the second circuit board 300 in the second direction Y. The plurality of second pads PE_B may be arranged in the second pad area PA_B. The plurality of second pads PE_B may be arranged in one row in one direction. For example, the plurality of second pads PE_B may be arranged along the first direction X. The present disclosure is not necessarily limited thereto, and the second pads PE_B may form multiple rows. The second pad PE_B may be made of any one of copper (Cu), tin (Sn), gold (Au), nickel (Ni), or the like, and may be formed as a single layer or a multilayer.

The width of each second bump BP_B may be smaller than the width of each second pad PE_B. However, the present disclosure is not necessarily limited thereto, and the width of the second bump BP_B may be greater than or equal to the width of the second pad PE_B.

The material of the second bump BP_B is not necessarily limited as long as it may easily bond to the second pad PE_B. For example, the second bump BP_B may be made of one or more materials among gold (Au), nickel (Ni) and tin (Sn). The second bump BP_B may have a single layer structure or a stacked structure made of the above materials.

Each second bump BP_B may be bonded and electrically connected to each second pad PE_B of the second circuit board 300. The second bump BP_B and the second pad PE_B may be bonded to each other by a second adhesive layer ACF2 disposed therebetween. The present disclosure is not necessarily limited thereto, and the second bump BP_B may be directly bonded to the second pad PE_B of the second circuit board 300 without another layer or another component interposed therebetween. Such direct bonding may be performed by ultrasonic bonding.

Figure 6:
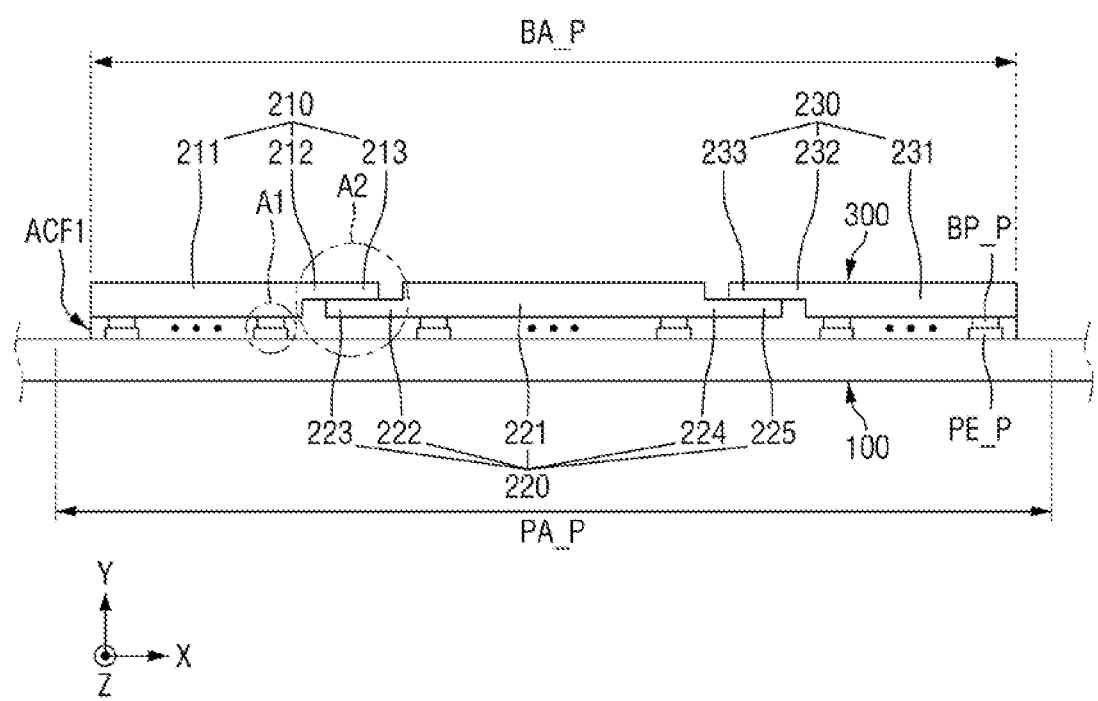
FIG. 6 is a cross-sectional view taken along line VI-VI' of FIG. 2.
Figure 7:
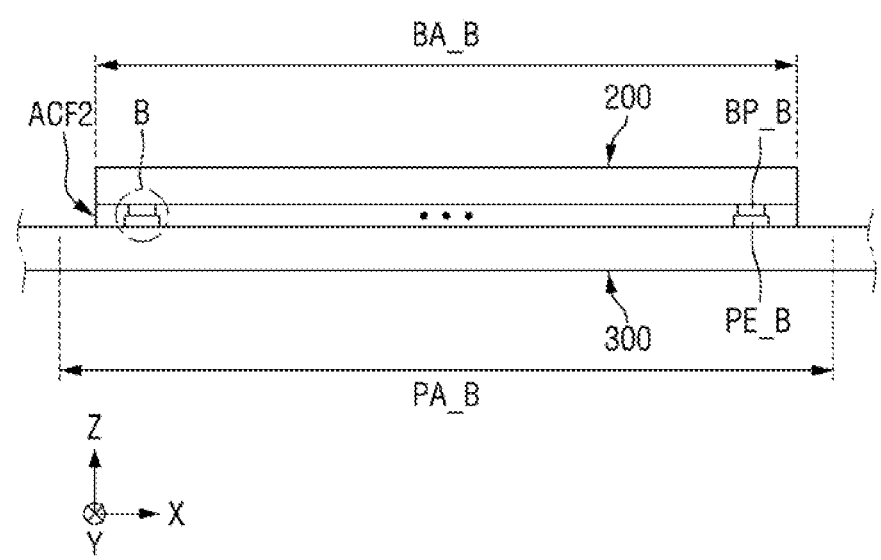
FIG. 7 is a cross-sectional view taken along line VII-VII' of FIG. 2.
Figure 8:
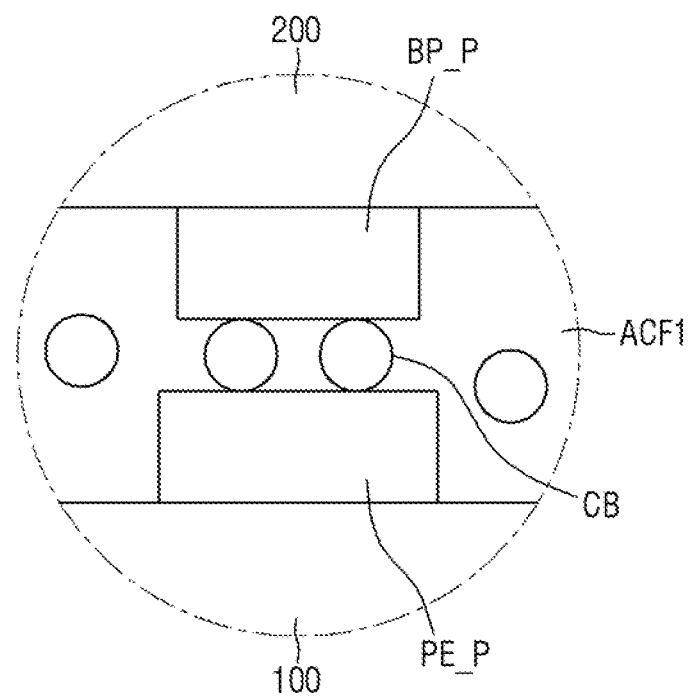
FIG. 8 is an enlarged view of area A1 of FIG. 6.
Figure 9:
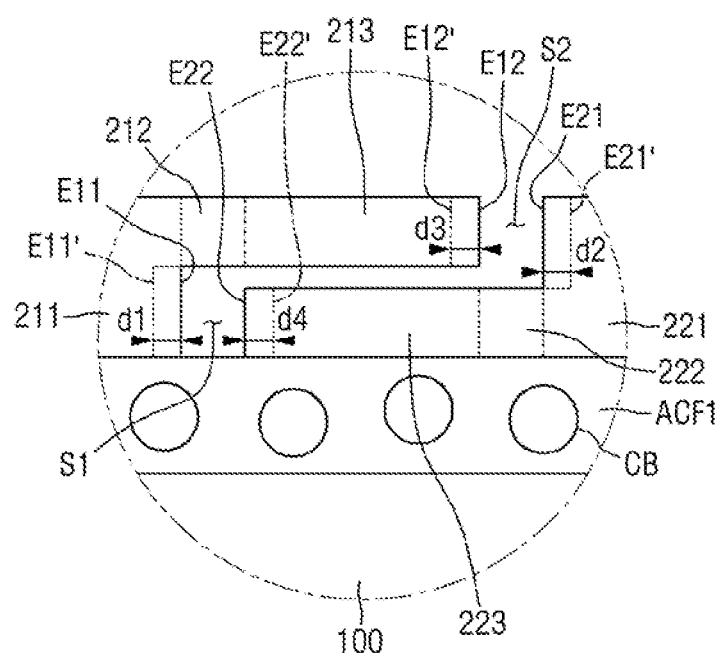
FIG. 9 is an enlarged view of area A2 of FIG. 6.
Figure 10:
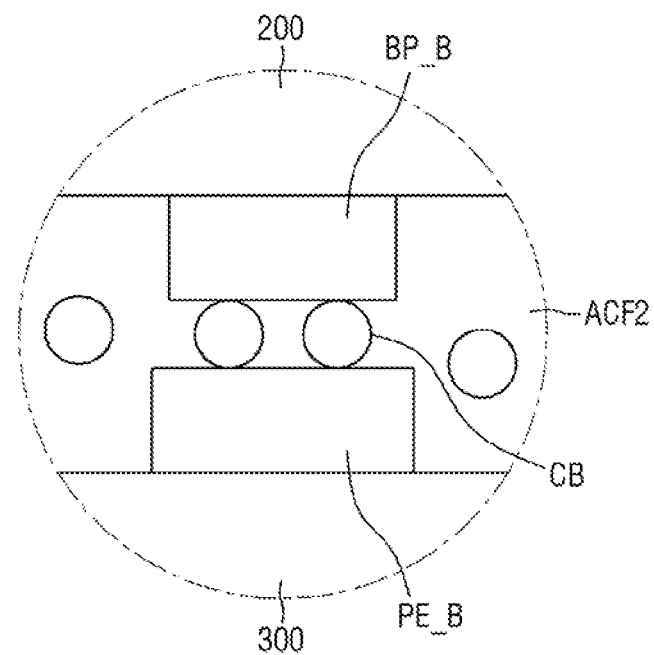
FIG. 10 is an enlarged view of area B of FIG. 7.

FIG. 6 is a cross-sectional view taken along line VI-VI' of FIG. 2. FIG. 7 is a cross-sectional view taken along line VII-VII' of FIG. 2. FIG. 8 is an enlarged view of area A1 of FIG. 6. FIG. 9 is an enlarged view of area A2 of FIG. 6. FIG. 10 is an enlarged view of area B of FIG. 7.

Referring to FIGS. 6 and 8, the first bump area BA_P and the first pad area PA_P may be attached to each other by the first adhesive layer ACF1 disposed therebetween. The first adhesive layer ACF1 may be an anisotropic conductive film (ACF) containing conductive balls CB. The conductive balls CB contained in the first adhesive layer ACF1 may be disposed between the first bump BP_P and the first pad PE_P. One side of the conductive balls CB may be in direct contact with the first bump BP_P, and the other side of the conductive balls CB may be in direct contact with the first pad PE_P. Accordingly, the first bump BP_P and the first pad PE_P may be electrically connected to each other.

Referring to FIGS. 7 and 10, the second bump area BA_B and the second pad area PA_B may be adhered by the second adhesive layer ACF2 disposed therebetween. The second adhesive layer ACF2 may be an anisotropic conductive film (ACF) containing conductive balls CB. The conductive balls CB contained in the second adhesive layer ACF2 may be disposed between the second bump BP_B and the second pad PE_B. One side of the conductive balls CB may be in direct contact with the second bump BP_B, and the other side of the conductive balls CB may be in direct contact with the second pad PE_B. Accordingly, the second bump BP_B and the second pad PE_B may be electrically connected to each other.

Unless stated otherwise, the terms "one side" and "the other side" may refer to opposite sides along the same direction. With reference to FIGS. 6 and 9, the first divided board portion 210 may include a first base portion 211, a first non-overlapping protrusion 212 extending from the first base portion 211 toward one side in the first direction X, and a first overlapping protrusion 213 extending from the first non-overlapping protrusion 212 toward one side in the first direction X and overlapping the second divided board portion 220. The thickness of the first base portion 211 may be greater than the thickness of the first non-overlapping protrusion 212 and the thickness of the first overlapping protrusion 213. The first non-overlapping protrusion 212 and the first overlapping protrusion 213 may have the same thickness, but the present disclosure is not necessarily limited thereto.

The second divided board portion 220 may include a second base portion 211, a second non-overlapping protrusion 222 extending from the second base portion 221 toward the other side in the first direction X, a second overlapping protrusion 223 extending from the second non-overlapping protrusion 222 toward the other side in the first direction X and overlapping the first divided board portion 210, a fourth non-overlapping protrusion 224 extending from the second base portion 221 toward one side in the first direction X without overlapping the third divided board portion 230, and a fourth overlapping protrusion 225 extending from the fourth non-overlapping protrusion 224 toward one side in the first direction X and overlapping the third divided board portion 230. The thickness of the second base portion 221 may be greater than the thicknesses of the second non-overlapping protrusion 222, the second overlapping protrusion 223, the fourth non-overlapping protrusion 224, and the fourth overlapping protrusion 225. The second non-overlapping protrusion 222, the second overlapping protrusion 223, the fourth non-overlapping protrusion 224, and the fourth overlapping protrusion 225 may have the same thickness, but the present disclosure is not necessarily limited thereto.

The third divided board portion 230 may include a third base portion 231, a third non-overlapping protrusion 232 extending from the third base portion 231 toward the other side in the first direction X without overlapping the second divided board portion 220, and a third overlapping protrusion 233 extending from the third non-overlapping protrusion 232 toward the other side in the first direction X and overlapping the second divided board portion 220. The thickness of the third base portion 231 may be greater than the thickness of the third non-overlapping protrusion 232 and the thickness of the third overlapping protrusion 233. The third non-overlapping protrusion 232 and the third overlapping protrusion 233 may have the same thickness, but the present disclosure is not necessarily limited thereto.

As shown in FIG. 9, the first circuit board 200 included in the display device 1 according to an embodiment may include a first base edge E11 located at one side of the first base portion 211 in the first direction X, a second base edge E21 located at the other side of the second base portion 221 in the first direction X, a first protruding edge E12 located at one side of the first overlapping protrusion 213 in the first direction X after attachment, and a second protruding edge E22 located at the other side of the second overlapping protrusion 223 in the first direction X after attachment. In FIG. 2, the first base edge E11 and the second protruding edge E22 may extend in a left and upward direction in plan view, and the second base edge E21 and the first protruding edge E12 may extend in a right and upward direction in plan view. The first base edge E11 and the second base edge E21 may have curved surfaces, and may have substantially the same shape. The first protruding edge E12 and the second protruding edge E22 may have curved surfaces, and may have substantially the same shape.

The lengths of the first base edge E11, the second base edge E21, the first protruding edge E12, and the second protruding edge E22 in their respective extending directions may be greater than the length of the first bump BP_P in the second direction Y.

The first overlapping protrusion 213 and the second overlapping protrusion 223 may overlap each other in the thickness direction. The first overlapping protrusion 213 may be, but not necessarily, disposed above the second overlapping protrusion 223. The first overlapping protrusion 213 and the second overlapping protrusion 223 may be spaced apart from each other in the thickness direction.

The first circuit board 200 may be attached to the display panel 100 through the first adhesive layer ACF1. Attaching the first circuit board 200 to the display panel 100 may be performed by a thermo-compression bonding process of applying heat and pressure with the first adhesive layer ACF1 interposed therebetween. The first circuit board 200 may be stretched in the first direction X by the thermo-compression bonding process.

In the following description with reference to FIG. 9, the "prime" edges of the first circuit board 200 (e.g., E11', E12', E21' etc.) may represent positions of the respective edges before the attachment process. The "nonprime" edges of the first circuit board 200 (e.g., E11, E12, E21 etc.) may represent positions of the respective edges after the attachment process. Accordingly, the first base edge E11 may be moved toward one side in the first direction X during the attachment process by a first distance d1 from a first' base edge E11'. Further, the second base edge E21 may be moved toward the other side in the first direction X by a second distance d2 during the attachment process from a second' base edge E21'. The first protruding edge E12 may be moved toward one side in the first direction X by a third distance d3 during the attachment process from a first' protruding edge E12'. The second protruding edge E22 may be moved toward the other side in the first direction X by a fourth distance d4 during the attachment process from the second' protruding edge E22'. The first to fourth distances d1, d2, d3, and d4 stretched in each area may be, but not necessarily, substantially the same length.

After the process of attaching the first circuit board 200, a volume of a first space S1 defined by the first base edge E11, the second protruding edge E22, and the bottom surface of the first non-overlapping protrusion 212 and a volume of a second space S2 defined by the second base edge E21, the first protruding edge E12, and the top surface of the second non-overlapping protrusion 222 may be decreased.

Although the overlapping area OA where the first divided board portion 210 and the second divided board portion 220 overlap has been described above, the overlapping area OA where the second divided board portion 220 and the third divided board portion 230 overlap may have the substantially the same shape.

With reference to FIGS. 2, 6 and 7, the first circuit board 200 included in the display device 1 according to an embodiment may include the first bump area BA_P divided into the plurality of portions and including the overlapping areas OA. In the thermo-compression bonding process of attaching the first circuit board 200 to the display panel 100, the first bump area BA_P may be stretched in the first direction X. The amount of stretching of the first bump area BA_P may be proportional to the length. The amount of stretching of the first bump area BA_P may be greater at the outer portion than at the central portion. For example, the first bump area BA_P may be stretched more toward the outer portion. Referring to FIG. 6, in the first circuit board 200 according to an embodiment, the first bump area BA_P may be divided into the plurality of portions to distribute the amount of stretching. Therefore, the uniformity of the amount of stretching of the first bump area BA_P for each area may be increased. Accordingly, the alignment error between the first pad PE_P and the first bump BP_P may be minimized.

FIGS. 11 to 16 are schematic diagrams illustrating a method of manufacturing a display device according to an embodiment. Specifically, FIGS. 11 to 16 are schematic diagrams illustrating a method of manufacturing a first circuit board included in a display device according to an embodiment.

Referring to FIGS. 11 to 16, the method of manufacturing the display device 1 according to an embodiment may include preparing the first circuit board 200 including the first to third bump areas BA_P, BA_B, and BA_C, forming a dividing line DL by cutting a part of the first bump area BA_P, stretching the first bump area BA_P, removing a part of the first bump area BA_P, and arranging the top surface and the bottom surface of the first bump area BA_P.

Figure 11:
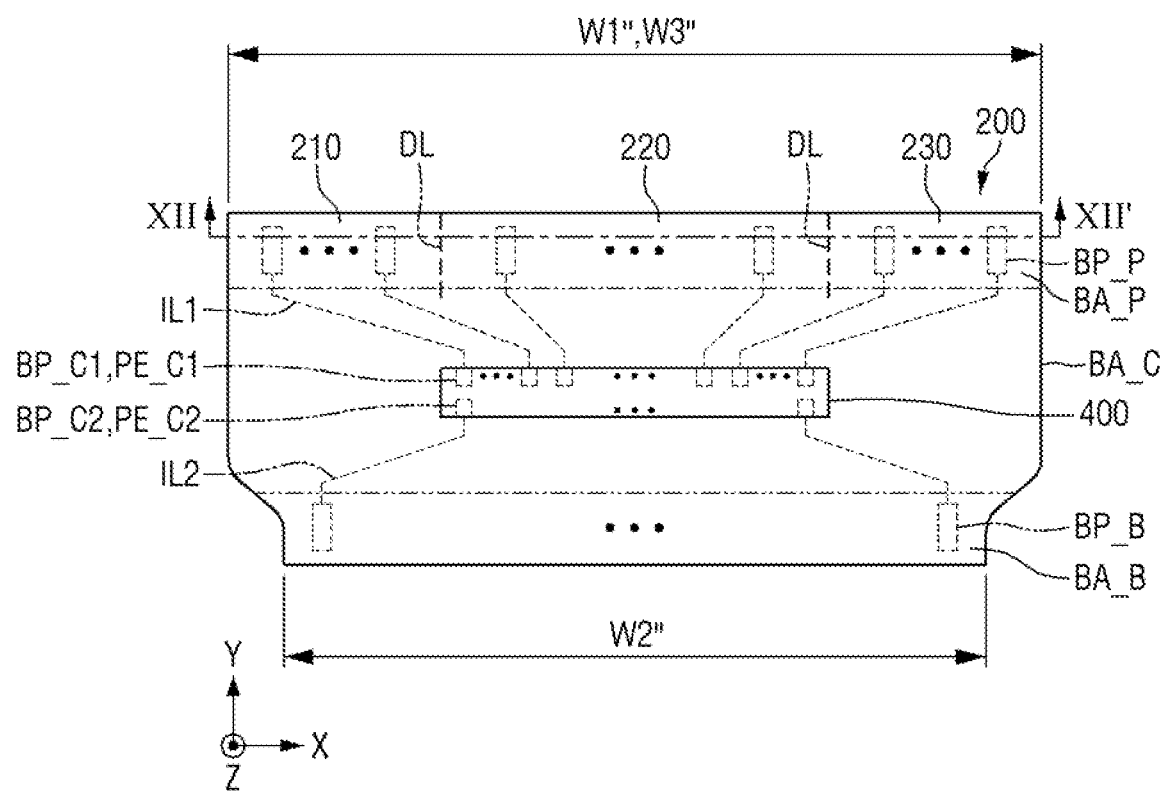
FIGS. 11 to 16 are schematic diagrams illustrating a method of manufacturing a display device according to an embodiment.

Referring to FIG. 11, manufacturing the first circuit board 200 included in the display device 1 according to an embodiment may include preparing the first circuit board 200 including the first to third bump areas BA_P, BA_B, and BA_C. In the first circuit board 200 prepared at this stage, a first' width W1' of the first bump area BA_P and a third' width W3' of the third bump area BA_C may be substantially the same. However, a second' width W2' of the second bump area BA_B may be smaller than the first' width W1' of the first hump area BA_P and the third' width W3' of the third bump area BA_C.

The first bump area BA_P of the first circuit board 200 may be cut to form the dividing line DL. The step of forming the dividing line DL by cutting a part of the first bump area BA_P of the first circuit board 200 may be, but not necessarily, performed by using a laser beam.

Figure 12:
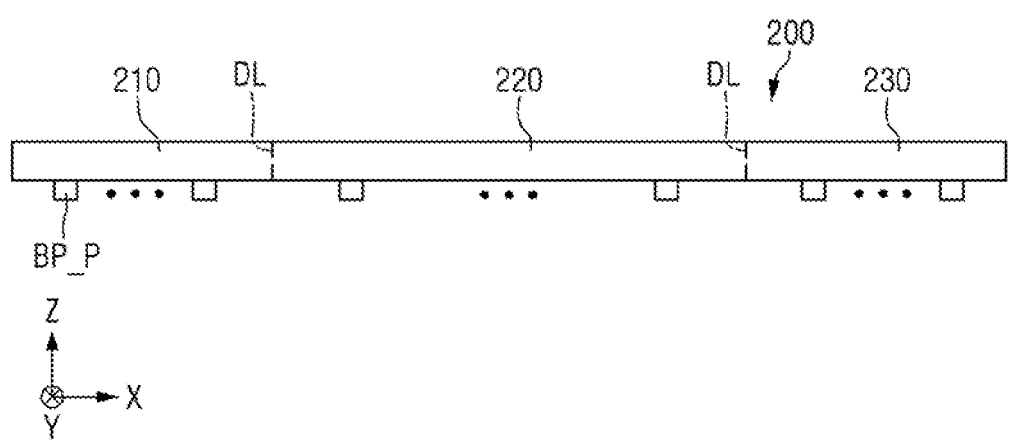
Figure 13:
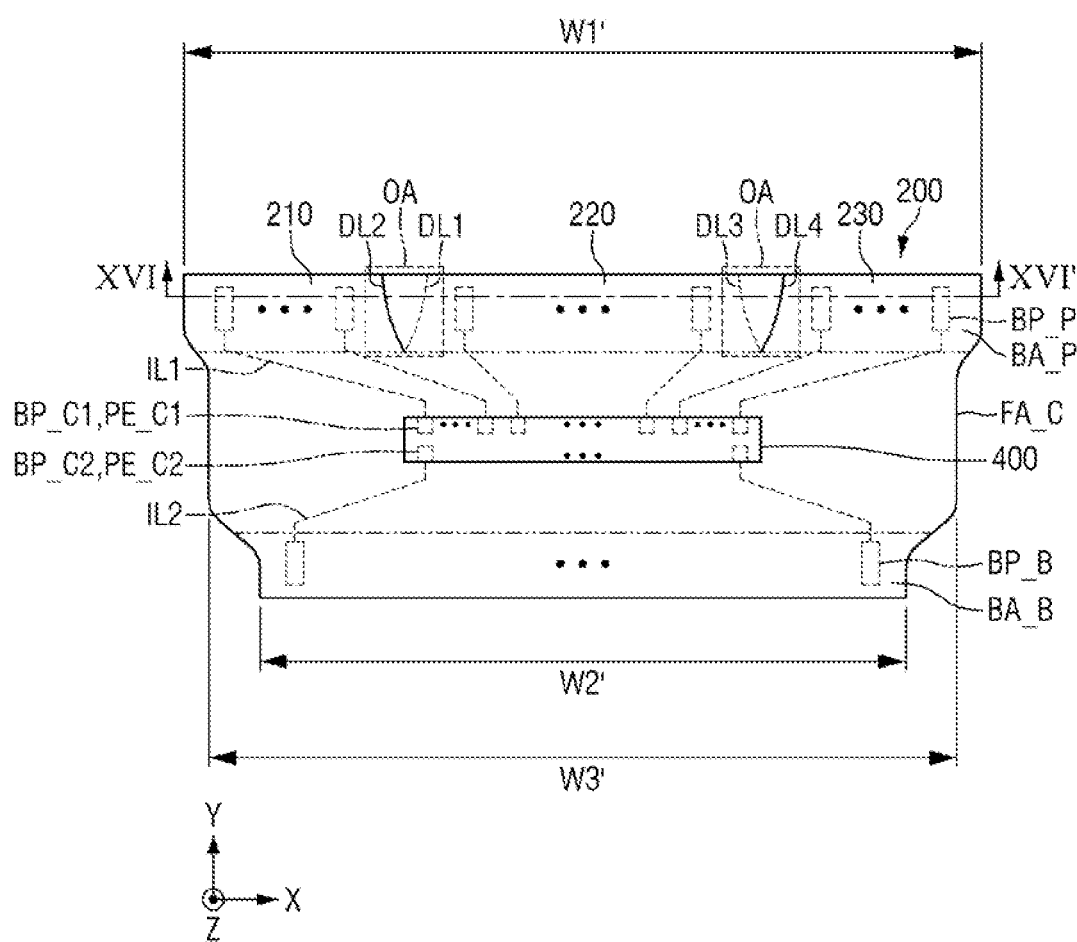

A plurality of dividing lines DL may be formed in the first bump area BA_P. Each dividing line DL may have a shape extending along the second direction Y and may be disposed along the first direction X. The length of each dividing line DL in the second direction Y may be greater than the length of the first bump BP_P in the second direction Y. Although FIGS. 11 and 12 show the first circuit board 200 in which two dividing lines DL are formed, the number of the dividing lines DL is not necessarily limited thereto. By forming the two dividing lines DL, the first bump area BA_P may be divided into the first to third divided board portions 210, 220, and 230. The first bump area BA_P may be divided into the first and second divided board portions 210 and 220 by one dividing line DL, and may be divided into the second and third divided board portions 220 and 230 by the other dividing line DL.

After forming the dividing line DL by cutting a part of the first bump area BA_P, the first bump area B_AP may be stretched. The step of stretching the first bump area BA_P may be performed by applying heat and pressure to the entire first bump area BA_P using a thermo-compression bonding device. As the first bump area BA_P is stretched in the first direction X, the first width W1 of the first bump area BA_P may become greater than the third width W3 of the third bump area BA_C. Further, the first width W1 of the first bump area BA_P may be uniform from one side toward the other side in the second direction Y and reduced at the area adjacent to the third bump area BA_C.

The first bump area BA_P may be stretched to form the overlapping area OA where the first and second divided board portions 210 and 220 partially overlap and the overlapping area OA where the second and third divided board portions 220 and 230 partially overlap.

Figure 14:
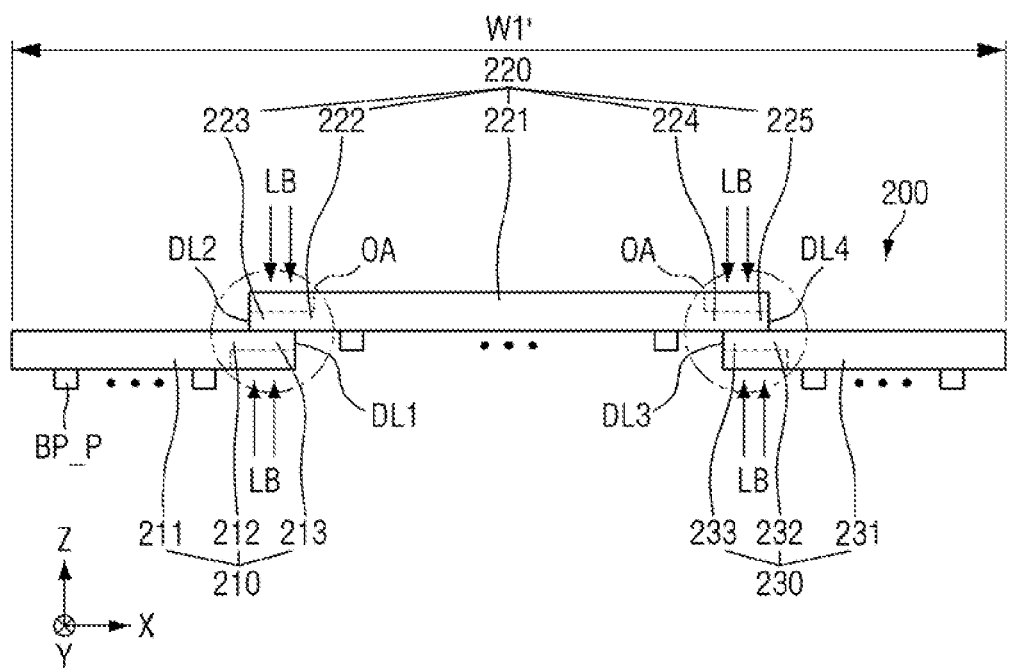

Referring to FIG. 14, in the overlapping area OA where the first and second divided board portions 210 and 220 partially overlap, the first overlapping protrusion 213 may be disposed below the second overlapping protrusion 223. Further, in the overlapping area OA where the second and third divided board portions 220 and 230 partially overlap, the third overlapping protrusion 233 may be disposed below the fourth overlapping protrusion 225. For example, one edge DL1 of the first divided board portion 210 in the first direction X may be located below the second divided board portion 220. The other edge DL2 of the second divided board portion 220 in the first direction X may be located above the first divided board portion 210. One edge DL4 of the second divided board portion 220 in the first direction X may be located above the third divided board portion 230. The other edge DL3 of the third divided board portion 230 in the first direction X may be located below the second divided board portion 220. However, the present disclosure is not necessarily limited thereto, and the vertical arrangement of the divided board portions in each overlapping area OA may be changed.

Figure 15:
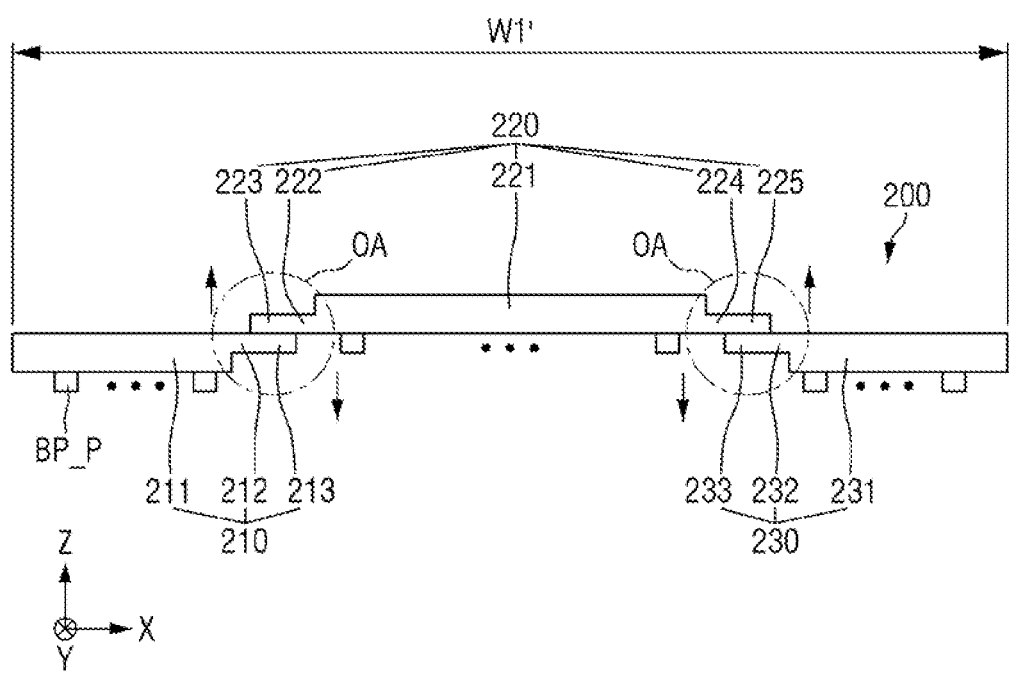

Referring to FIG. 15, after the step of stretching the first bump area BA_P, a part of the first bump area BA_P may be removed. The step of removing a part of the first bump area BA_P may be performed by irradiating a laser beam. A part of the first bump area BA_P may be removed by the energy provided by the laser beam. The laser beam may be irradiated from one side and the other side of the first bump area BA_P in the third direction Z. Therefore, in the first bump area BA_P to which the laser beam is irradiated, the portions exposed to one side and the other side in the third direction Z may be removed. The laser beam may be irradiated to the area where the first and second divided board portions 210 and 220 overlap and its adjacent area, and the area where the second and third divided board portions 220 and 230 overlap and its adjacent area. The laser beam may not be irradiated to the area where the first bump BP_P is disposed. After a part of the first bump area BA_P is removed by the laser beam, the first base portion 211, the first non-overlapping protrusion 212, the first overlapping protrusion 213, the second base portion 221, the second non-overlapping protrusion 222, the second overlapping protrusion 223, the fourth non-overlapping protrusion 224, the fourth overlapping protrusion 225, the third base portion 231, the third non-overlapping protrusion 232, and the third overlapping protrusion 233 that have been described with reference to FIGS. 6 to 9 may be formed. The top surface of the first overlapping protrusion 213 and the bottom surface of the second overlapping protrusion 223 may be arranged to face each other. Further, the top surface of the third overlapping protrusion 233 and the bottom surface of the fourth overlapping protrusion 225 may be arranged to face each other.

Figure 16:
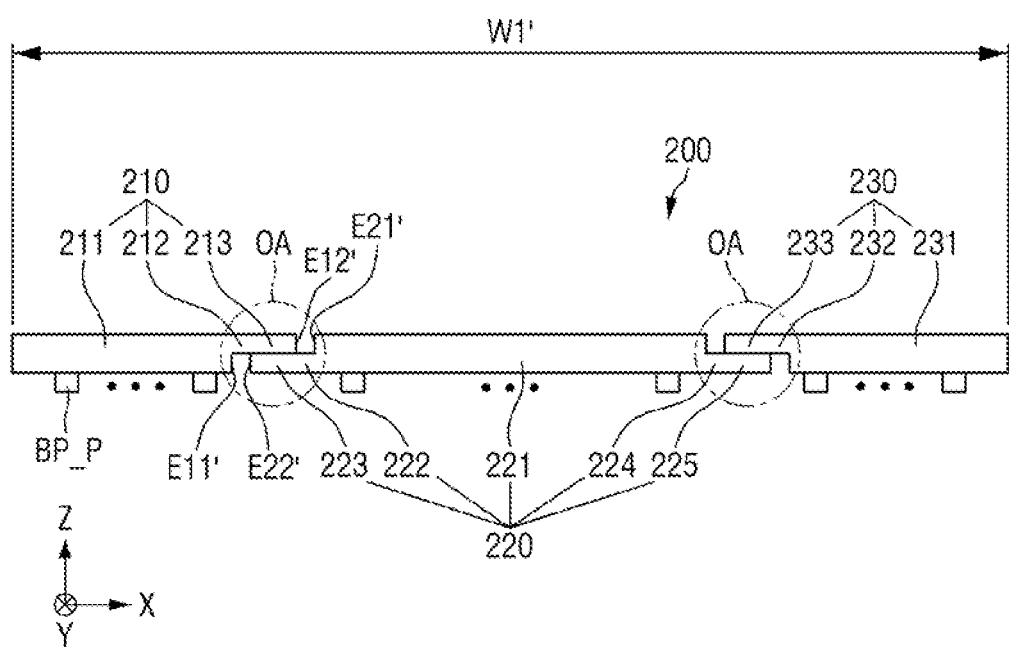

Referring to FIG. 16, after the step of removing a part of the first bump area BA_P, the step of arranging the top surface and the bottom surface of the first bump area BA_P may be performed. The step of arranging the top surface and the bottom surface of the first bump area BA_P may be performed by pressing the second divided board portion 220 toward the other side (moving the second divided board portion "lower") in the third direction Z or by pressing the first divided board portion 210 and the third divided board portion 230 toward one side (moving the first divided board portion 210 and the third divided board portion 230 "higher") in the third direction Z. The first overlapping protrusion 213 and the second overlapping protrusion 223 cross each other, and the third overlapping protrusion 233 and the fourth overlapping protrusion 225 cross each other. Accordingly, the top surfaces of the first to third divided board portions 210, 220, and 230 may be aligned on the same plane, and the bottom surfaces of the first to third divided hoard portions 210, 220, and 230 may be aligned the same plane. In the first circuit board 200 that has been subjected to this step, the top surface of the first overlapping protrusion 213 and the bottom surface of the second overlapping protrusion 223 may be arranged to face each other. Further, the top surface of the third overlapping protrusion 233 and the bottom surface of the fourth overlapping protrusion 225 may be arranged to face each other.

Hereinafter, other embodiments of the first circuit board 200 and the display device 1 including the same will be described. In the following embodiments, a description of the same components as those of the above-described embodiment will be omitted or simplified, and differences will be mainly described.

Figure 17:
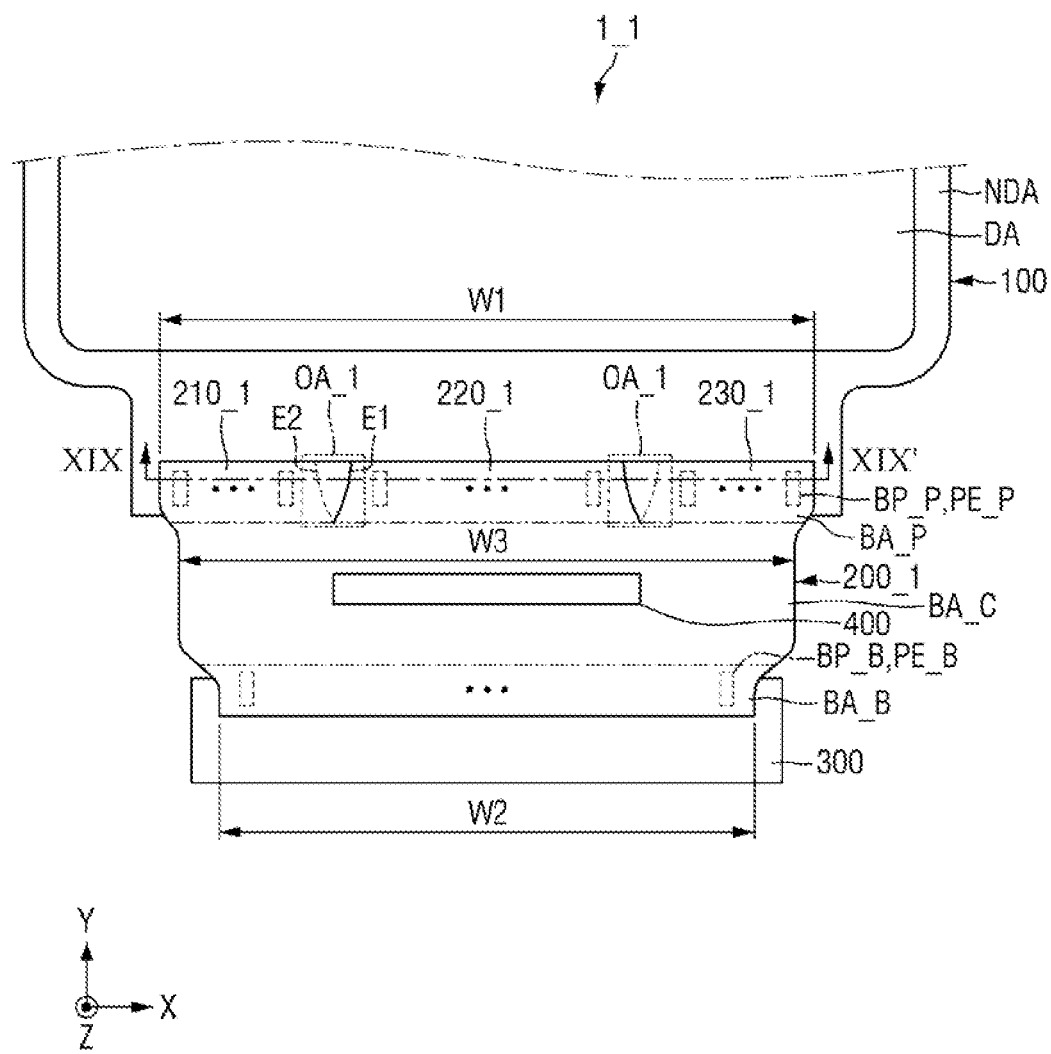
FIG. 17 is a plan layout view of a display device according to another embodiment.
Figure 18:
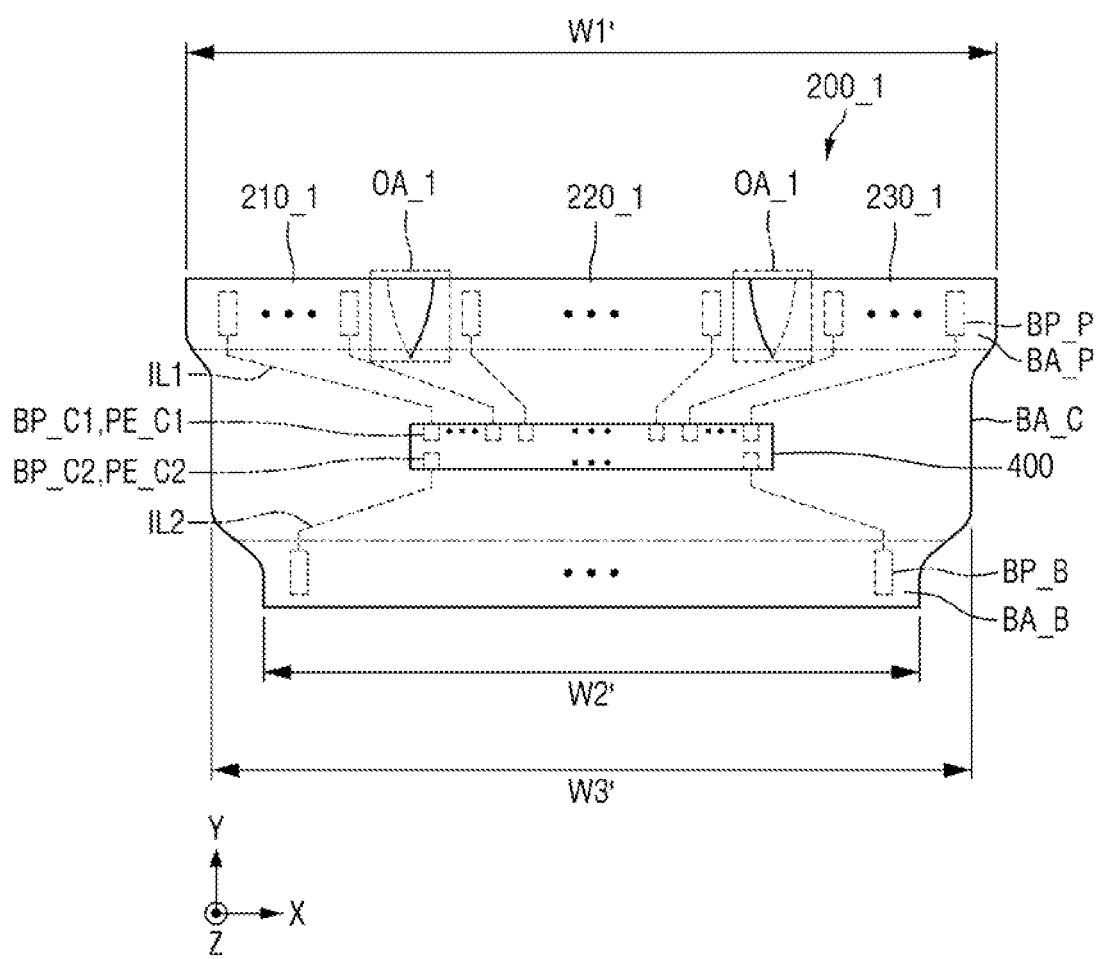
FIG. 18 is a plan view of a first circuit board included in the display device according to the embodiment of FIG. 17.
Figure 19:
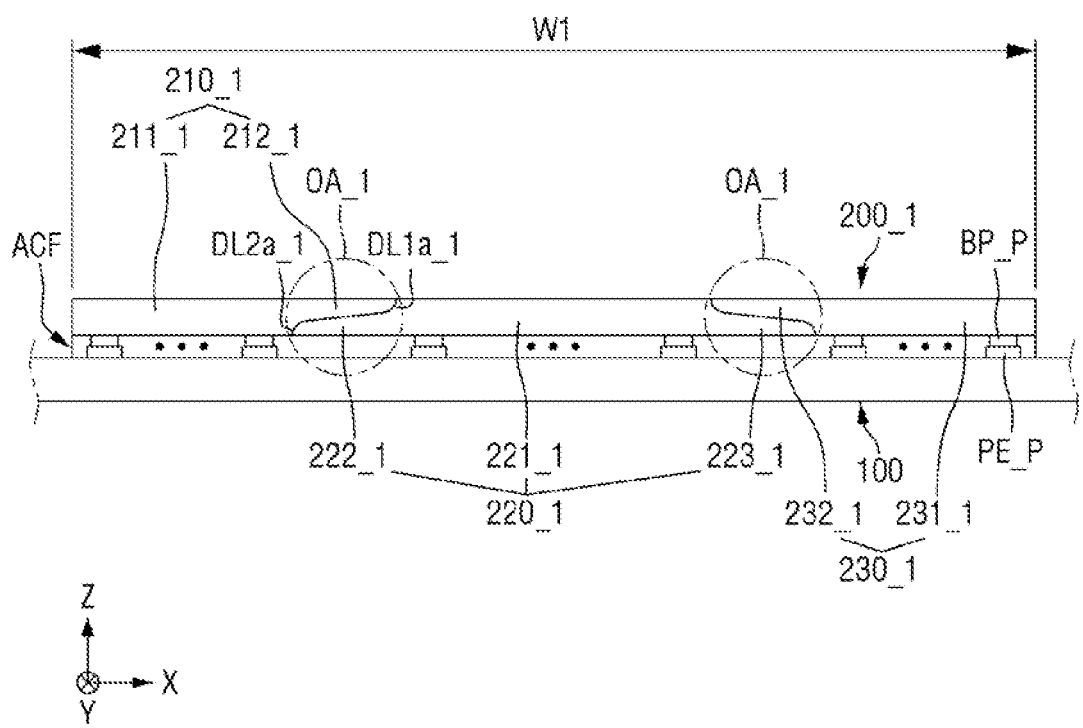
FIG. 19 is a cross-sectional view taken along line XIX-XIX' of FIG. 17.

FIG. 17 is a plan layout view of a display device according to another embodiment. FIG. 18 is a plan view of a first circuit board included in the display device according to the embodiment of FIG. 17. FIG. 19 is a cross-sectional view taken along line XIX-XIX' of FIG. 17.

Referring to FIGS. 17 to 19, a display device 1_1 according to the present embodiment may include a first circuit board 200_1 including overlapping areas OA_1 whose shape is different from that of the first circuit board 200 included in the display device 1 according to an embodiment. In the present embodiment, the first circuit board 200_1 may include first to third divided board portions 210_1, 220_1, and 230_1.

The first divided board portion 210_1 may include a first base portion 211_1 and a first protrusion 212_1 protruding from the first base portion 211_1 toward one side in the first direction X. The thickness of the first base portion 211_1 may be greater than the thickness of the first protrusion 212_1.

The second divided board portion 220_1 may include a second base portion 221_1, a second protrusion 222_1 protruding from the second base portion 221_1 toward the other side in the first direction X, and a fourth protrusion 223_1 protruding from the second base portion 221_1 toward one side in the first direction X. The thickness of the second base portion 221_1 may be greater than the thickness of the second protrusion 222_1 and the thickness of the fourth protrusion 223_1. The second protrusion 222_1 and the fourth protrusion 223_1 may, but not necessarily, have the same thickness.

The third divided board portion 230_1 may include a third base portion 231_1, and a third protrusion 232_1 protruding from the third base portion 231_1 toward the other side in the first direction X. The thickness of the third base portion 231_1 may be greater than the thickness of the third protrusion 232_1.

The first protrusion 212_1 may be disposed on the second protrusion 222_1. The first protrusion 212_1 may overlap the second protrusion 222_1 in the thickness direction. The first protrusion 212_1 and the second protrusion 222_1 may be in contact with each other. However, the present disclosure is not necessarily limited thereto, and the first protrusion 212_1 and the second protrusion 222_1 may be spaced apart from each other.

The fourth protrusion 223_1 may be disposed below the third protrusion 232_1. The third protrusion 232_1 may overlap the fourth protrusion 223_1 in the thickness direction. The third protrusion 232_1 and the fourth protrusion 223_1 may be in contact with each other. However, the present disclosure is not necessarily limited thereto, and the third protrusion 232_1 and the fourth protrusion 223_1 may be spaced apart from each other.

As shown in FIGS. 11 and 12, the overlapping areas OA_1 of the first circuit board 200_1 according to the present embodiment may be formed by locally applying energy only to the area adjacent to the dividing line DL in the first circuit board 200_1 where the dividing line DL is formed. The overlapping areas OA_1 may be formed by applying the energy higher than that in the thermo-compression bonding process used in the method of manufacturing the display device 1 described with reference to FIGS. 11 to 16. In the case of locally heating only the area adjacent to the dividing line DL, a separating layer may be disposed between the first protrusion 212_1 and the second protrusion 222_1 and between the third protrusion 232_1 and the fourth protrusion 223_1 to prevent fusion bonding therebetween. However, the present disclosure is not necessarily limited thereto.

The first circuit board 200_1 included in the display device 1_1 according to the present embodiment may include a first bump area BA_P divided into the plurality of portions and including the overlapping areas OA_1. In the thermo-compression bonding process of attaching the first circuit board 200_1 to the display panel 100, the first bump area BA_P may be stretched in the first direction X. The amount of stretching of the first bump area BA_P may be proportional to its initial length. The amount of stretching of the first bump area BA_P at outer portions may be greater than at the central portion. For example, the first bump area BA_P may be stretched more toward the outer portion. In the first circuit board 200_1 according to the present embodiment, the first bump area BA_P may be divided into the plurality of portions to distribute the amount of stretching. Therefore, it is possible to increase the uniformity of the amount of stretching of the first bump area BA_P for each area. Accordingly, the alignment error between the first pad PE_P and the first bump BP_P may be minimized.

Figure 20:
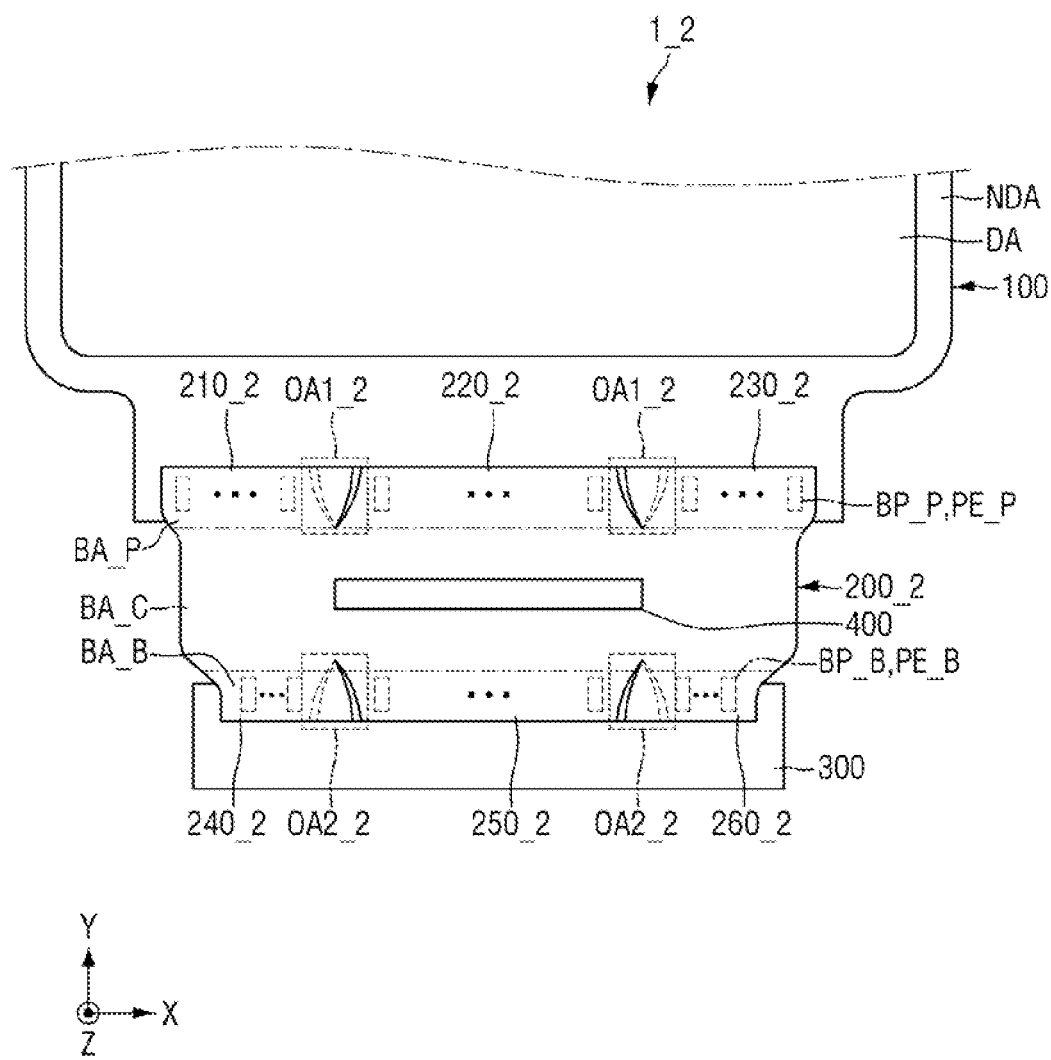
FIG. 20 is a plan layout view of a display device according to another embodiment.

FIG. 20 is a plan layout view of a display device according to another embodiment.

Referring to FIG. 20, a first circuit board 200_2 included in a display device 1_2 according to the present embodiment is different from that of the display device 1 according to an embodiment in that it includes first overlapping areas OA1_2 included in a first bump area BA_P and second overlapping areas OA2_2 included in a second bump area BA_B.

The first overlapping areas OA1_2 included in the first bump area BA_P may have substantially the same shape as those of the overlapping areas OA included in the first circuit board 200 included in the display device 1 according to an embodiment. The first bump area BA_P of the first circuit board 200_2 according to the present embodiment may include first to third divided board portions 210_2, 220_2, and 230_2.

The second overlapping areas OA2_2 included in the second bump area BA_B may have a vertically symmetrical structure with the first overlapping areas OA1_2 included in the first bump area BA_P. Additionally, the second bump area BA_B of the first circuit board 200_2 according to the present embodiment may include fourth to sixth divided board portions 240_2, 250_2, and 260_2.

The first circuit board 200_2 included in the display device 1_2 according to the present embodiment may include the first bump area BA_P divided into the plurality of portions and including the first overlapping areas OA1_2, and the second bump area BA_B divided into the plurality of portions and including the second overlapping areas OA2_2. In the thermo-compression bonding process of attaching the first circuit board 200_2 to the display panel 100, the first bump area BA_P and the second bump area BA_B may be stretched in the first direction X. The amount of stretching of the first bump area BA_P and the second bump area BA_B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_2 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Figure 21:
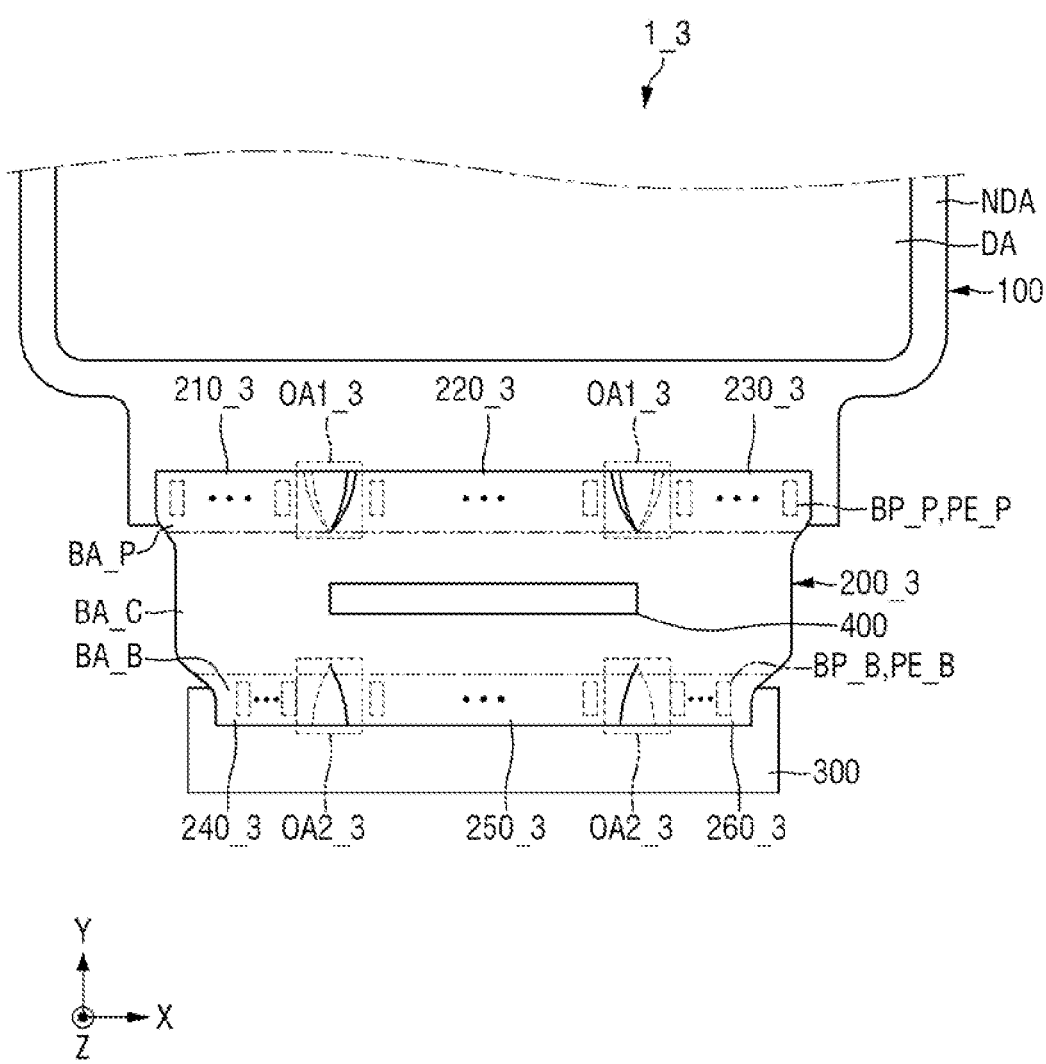
FIG. 21 is a plan layout view of a display device according to another embodiment.

FIG. 21 is a plan layout view of a display device according to still another embodiment.

Referring to FIG. 21, a first circuit board 200_3 included in a display device 1_3 according to the present embodiment is different from that of the display device 1 according to an embodiment in that it includes first overlapping areas OA1_3 included in a first bump area BA_P and second overlapping areas OA2_3 included in a second bump area BA_B.

The first overlapping areas OA1_3 included in the first bump area BA_P may have substantially the same shape as those of the overlapping areas OA included in the first circuit board 200 included in the display device 1 according to an embodiment. The first bump area BA_P of the first circuit board 200_3 according to the present embodiment may include first to third divided board portions 210_3, 220_3, and 230_3.

The second overlapping areas OA2_3 included in the second bump area BA_B may have substantially the same shape as those of the overlapping areas OA_1 included in the first bump area BA_P shown in FIGS. 17 to 19. For example, the second overlapping areas OA2_3 included in the second bump area BA_B may have the shape in which the overlapping areas OA_1 shown in FIGS. 17 to 19 are reversed upside down in the second direction Y. The second bump area BA_B of the first circuit board 200_3 according to the present embodiment may include fourth to sixth divided board portions 240_3, 250_3, and 260_3.

The first circuit board 200_3 included in the display device 1_3 according to the present embodiment may include the first bump area BA_P divided into the plurality of portions and including the first overlapping areas OA1_3 and the second bump area BA_B divided into the plurality of portions and including the second overlapping areas OA2_3. In the thermo-compression bonding process of attaching the first circuit board 200_3 to the display panel 100, the first bump area BA_P and the second bump area BA_B may be stretched in the first direction X. The amount of stretching of the first bump area BA_P and the second bump area B _B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_3 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Figure 22:
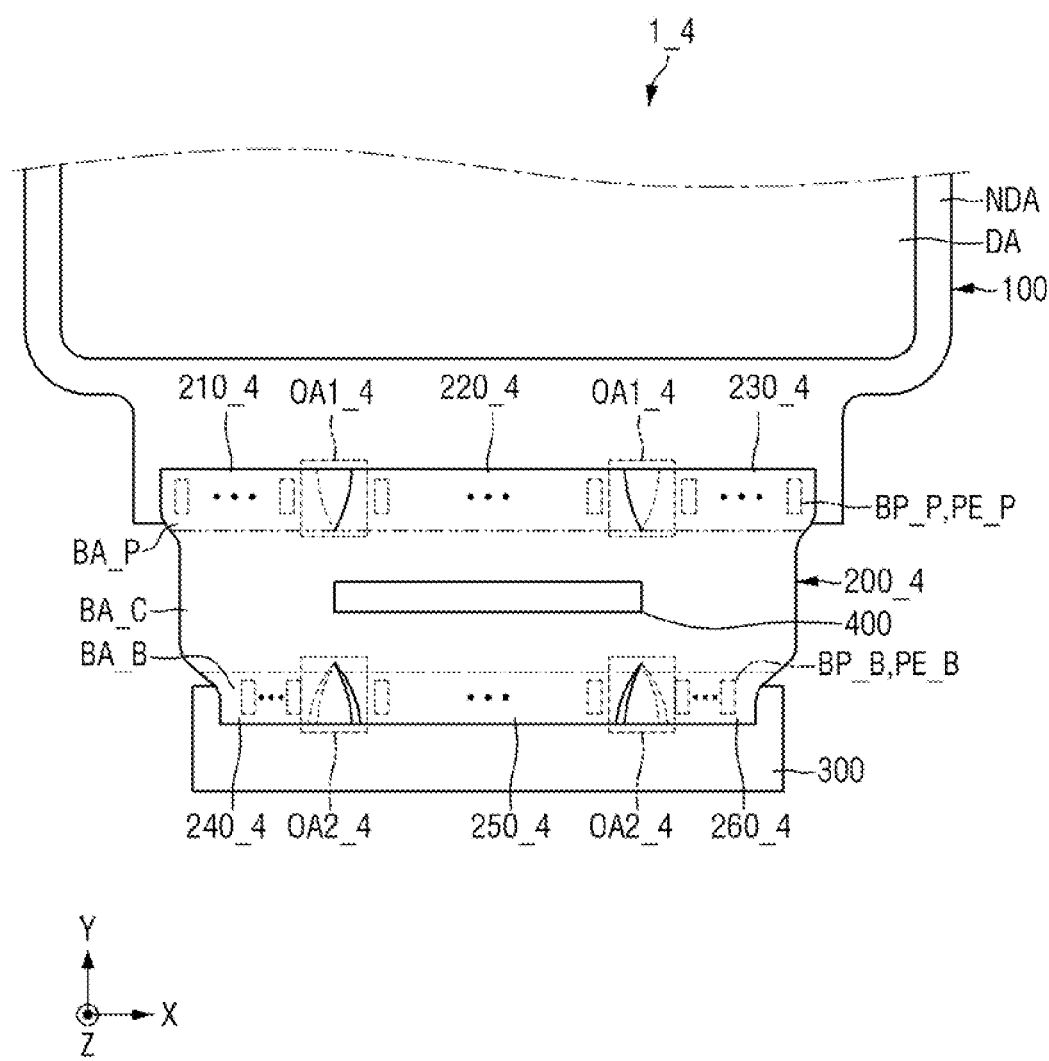
FIG. 22 is a plan layout view of a display device according to another embodiment.

FIG. 22 is a plan layout view of a display device according to still another embodiment.

Referring to FIG. 22, a first circuit board 200_4 included in a display device 1_4 according to the present embodiment is different from that of the display device 1 according to an embodiment in that it includes first overlapping areas OA1_4 included in a first bump area BA_P and second overlapping areas OA2_4 included in a second bump area BA_B.

The first overlapping areas OA1_4 included in the first bump area BA_P may have substantially the same shape as the shapes of the first overlapping areas OA1_1 included in the first circuit board 200_1 included in the display device 1_1 according to the above embodiment described with reference to FIGS. 17 to 19. The first bump area BA_P of the first circuit board 200_4 according to the present embodiment may include first to third divided board portions 210_4, 220_4, and 230_4.

The second overlapping areas OA2_4 included in the second bump area BA_B may have substantially the same shape as the shapes of the second overlapping areas OA2_2 included in the second bump area BA_B shown in FIG. 20. The second bump area BA_B of the first circuit board 200_4 according to the present embodiment may include fourth to sixth divided board portions 240_4, 250_4, and 260_4.

The first circuit board 200_4 included in the display device 1_4 according to the present embodiment may include the first bump area BA_P divided into the plurality of portions and including the first overlapping areas OA1_4, and the second bump area BA_B divided into the plurality of portions and including the second overlapping areas OA2_4. In the thermo-compression bonding process of attaching the first circuit board 200_4 to the display panel 100, the first bump area BA_P and the second bump area BA_B may be stretched in the first direction X. The amount of stretching of the first bump area BA_P and the second bump area BA_B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_4 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Figure 23:
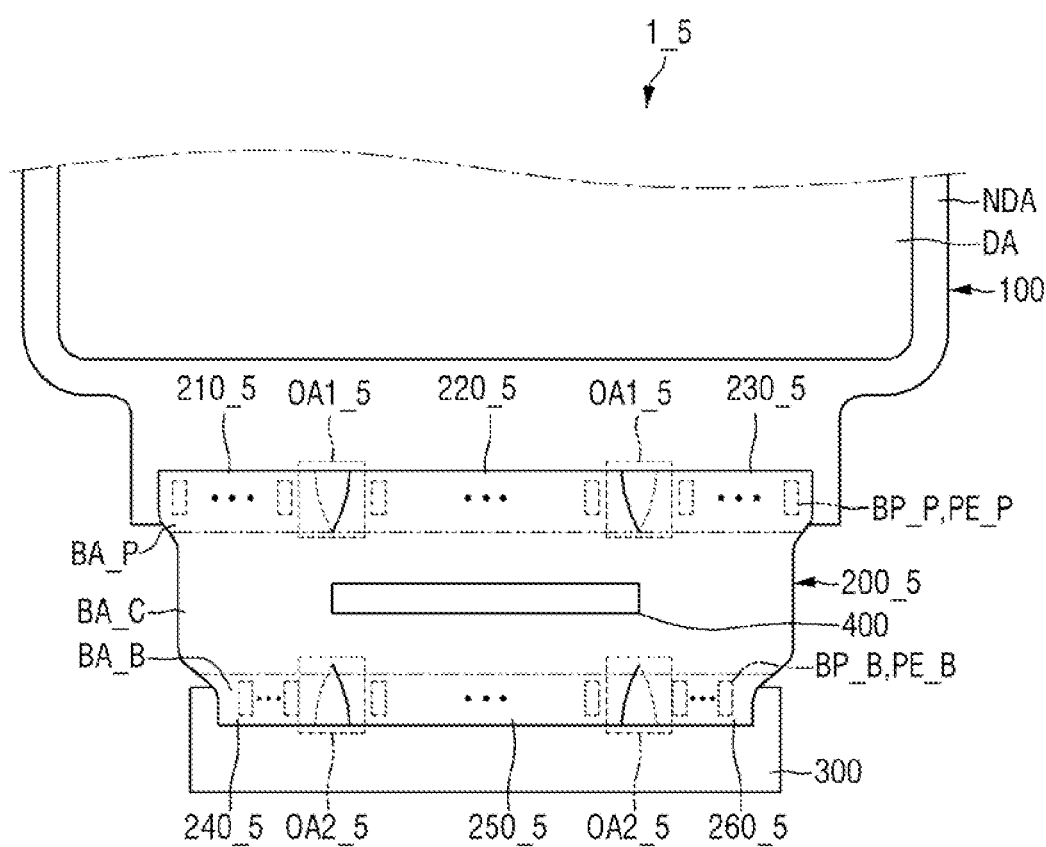
FIG. 23 is a plan layout view of a display device according to another embodiment.

FIG. 23 is a plan layout view of a display device according to still another embodiment.

Referring to FIG. 23, a first circuit board 200_5 included in a display device 1_5 according to the present embodiment is different from that of the display device 1 according to are embodiment in that it includes first overlapping areas OA1_5 included in a first bump area BA_P and second overlapping areas OA2_5 included in a second bump area BA_B.

The first overlapping areas OA1_5 included in the first bump area BA_P may have substantially the same shape as the shapes of the first overlapping areas OA1_1 included in the first circuit board 200_1 included in the display device 1_1 according to the above embodiment described with reference to FIGS. 17 to 19. The first bump area BA_P of the first circuit board 200_5 according to the present embodiment may include first to third divided board portions 210_5, 220_5, and 230_5.

The second overlapping areas OA2_5 included in the second bump area BA_B may have substantially the same shape as the shapes of the second overlapping areas OA2_3 included in the second bump area BA_B shown in FIG. 21. The second bump area BA_B of the first circuit board 200_5 according to the present embodiment may include fourth to sixth divided board portions 240_5, 250_5, and 260_5.

The first circuit board 200_5 included in the display device 1_5 according to the present embodiment may include the first bump area BA_P divided into the plurality of portions and including the first overlapping areas OA1_5 and the second bump area BA_B divided into the plurality of portions and including the second overlapping areas OA2_5. In the thermo-compression bonding process of attaching the first circuit board 200_5 to the display panel 100, the first bump area BA_P and the second bump area BA_B may be stretched in the first direction X. The amount of stretching of the first bump area BA_P and the second bump area BA_B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_5 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Figure 24:
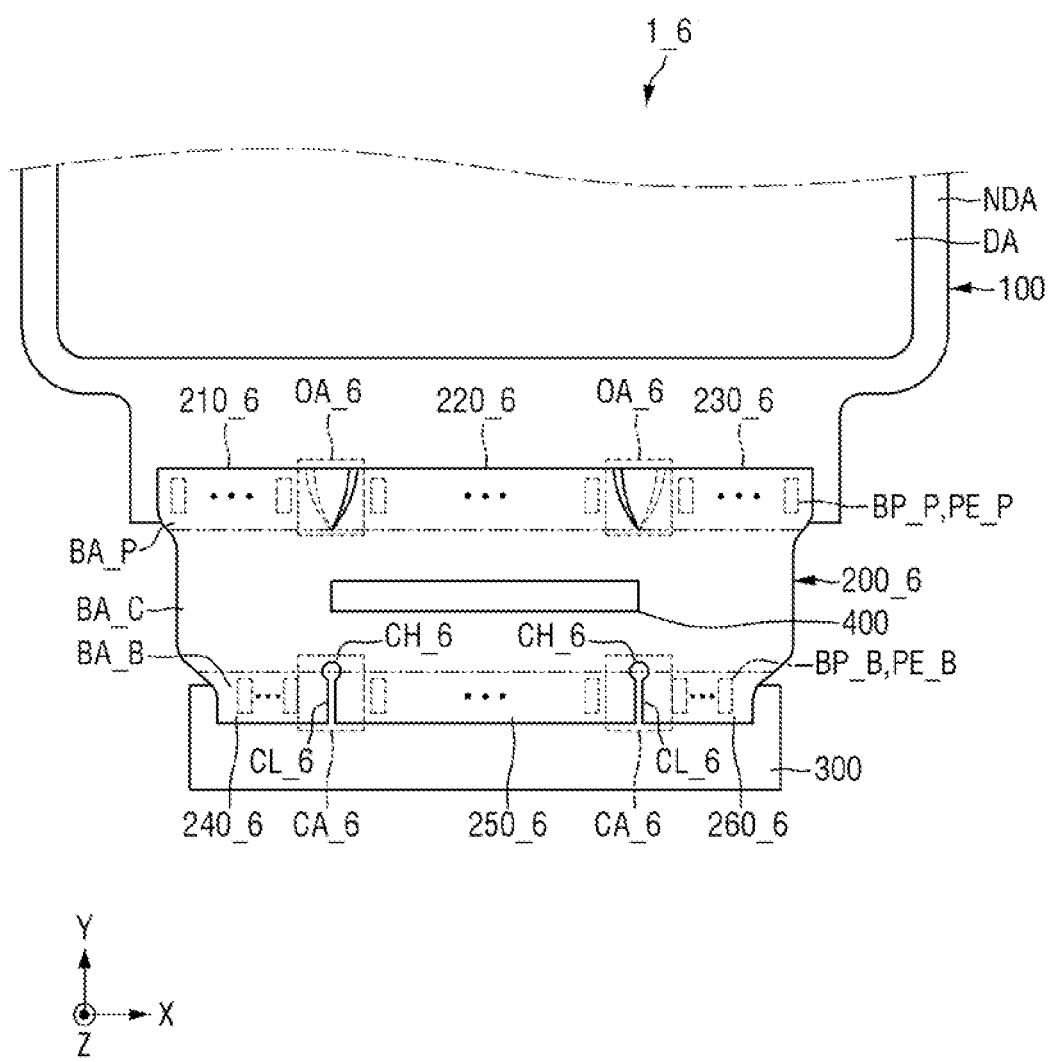
FIG. 24 is a plan layout view of a display device according to another embodiment.

FIG. 24 is a plan layout view of a display device according to still another embodiment.

Referring to FIG. 24, a first circuit board 200_6 included in a display device 1_6 according to the present embodiment is different from that of the display device 1 according to an embodiment in that it includes overlapping areas OA_6 included in a first bump area BA_P and cutout areas CA_6 included in a second bump area BA_B.

The overlapping areas OA_6 included in the first bump area BA_P may have substantially the same shape as those of the overlapping areas OA included in the first circuit board 200 included in the display device 1 according to an embodiment. The first bump area BA_P of the first circuit board 200_6 according to the present embodiment may include first to third divided board portions 210_6, 220_6, and 230_6.

The second bump area BA_B of the first circuit board 200_6 according to the present embodiment may include fourth to sixth divided board portions 240_6, 250_6, and 260_6. The fourth and fifth divided board portions 240_6 and 250_6 may be spaced apart from each other in the first direction X without overlapping each other. The fifth and sixth divided board portions 250_6 and 260_6 may be spaced apart from each other in the first direction X without overlapping each other.

The second bump area BA_B may further include cutout areas CA_6 disposed between the fourth divided board portion 240_6 and the fifth divided board portion 250_6 and between the fifth divided board portion 250_6 and the sixth divided board portion 260_6. Each cutout area CA_6 may have an elongated portion CL_6 and an enlarged portion CH_6. The elongated portion CL_6 may be a cutout area elongated from the other edge of the first circuit board 200_6 in the second direction Y toward one side in the second direction Y. The enlarged portion CH_6 may be a cutout area where the elongated portion CL_6 is terminated and may have a circular shape with a diameter greater than the width of the elongated portion CL_6. Due to the enlarged portion CH_6, it is possible to reduce shrinkage stress that may occur on the first circuit board 200_6 when the driving chip 400 is mounted.

The first circuit board 200_6 included in the display device 1_6 according to the present embodiment may include the first bump area BA_P divided into the plurality portions and including the overlapping areas OA_6 and the second bump area BA_B divided into the plurality of portions and including the cutout areas CA_6. In the thermocompression bonding process of attaching the first circuit board 200_6 to the display panel 100, the first bump area BA_P and the second bump area BA_B may be stretched in the first direction X. The amount of stretching of the first bump area BA_P and the second bump area BA_B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_6 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Figure 25:
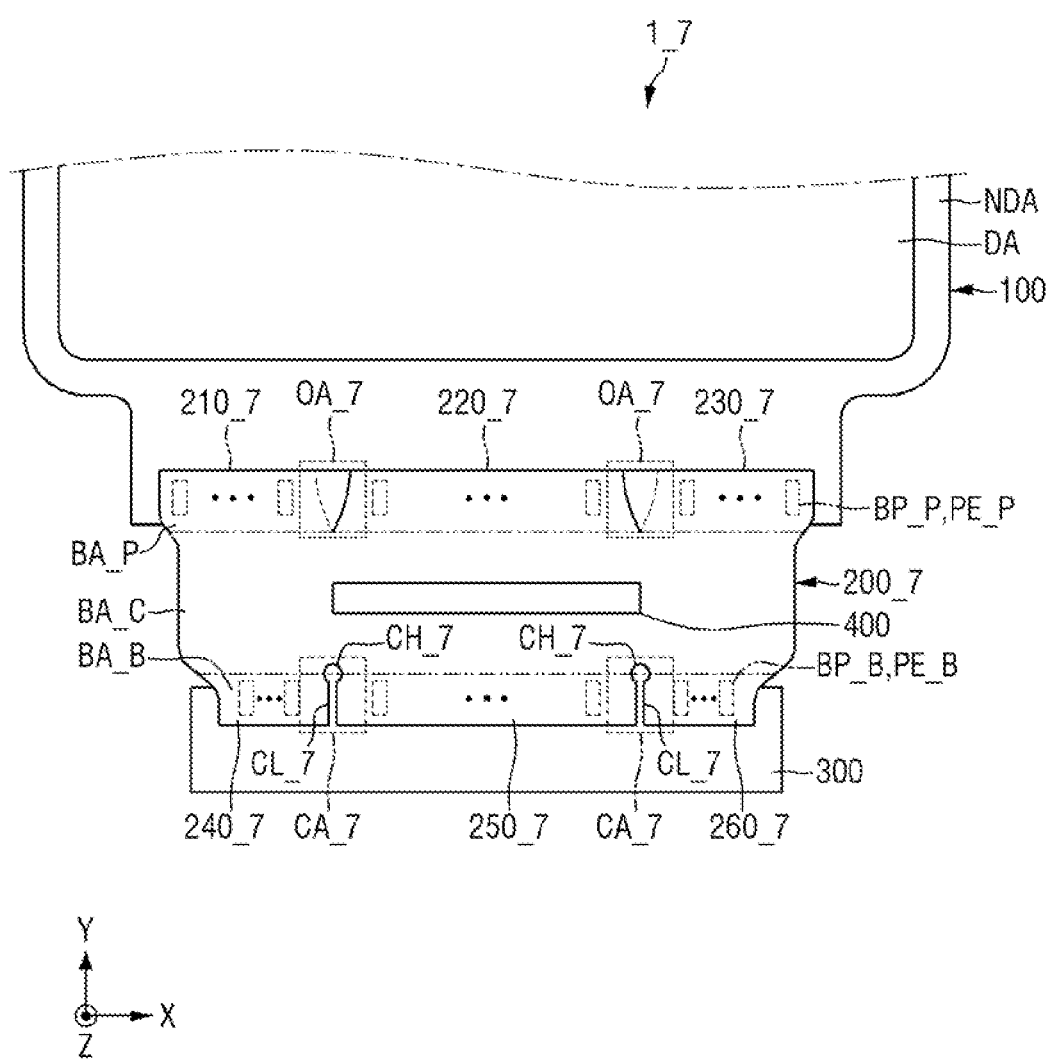
FIG. 25 is a plan layout view of a display device according to another embodiment.

FIG. 25 is a plan layout view of a display device according to still another embodiment.

Referring to FIG. 25, a first circuit hoard 200_7 included in a display device 1_7 according to the present embodiment is different from that of the display device 1 according to an embodiment in that it includes overlapping areas OA_7 included in a first bump area BA_P and cutout areas CA_7 included in a second bump area BA_B.

The overlapping areas OA_7 included in the first bump area BA_P may have substantially the same shape as those of the overlapping areas OA_1 included in the first circuit board 200_1 included in the display device 1_1 according to the above embodiment described with reference to FIGS. 17 to 19. The first bump area BA_P of the first circuit board 200_7 according to the present embodiment may include first to third divided board portions 210_7, 220_7, and 230_7.

The cutout areas CA_7 included in the second bump area BA_B may have substantially the same shape as those of the cutout areas CA_6 included in the second bump area BA_B shown in FIG. 24. The second bump area BA_B of the first circuit board 200_7 according to the present embodiment may include fourth to sixth divided board portions 240_7, 250_7, and 260_7.

The first circuit board 200_7 included in the display device 1_7 according to the present embodiment may include the first bump area BA_P divided into the plurality of portions and including the overlapping areas OA_7 and the second hump area BA_B divided into the plurality of portions and including the cutout areas CA_7. In the thermocompression bonding process of attaching the first circuit board 200_7 to the display panel 100, the first bump area BA_P and the second bump area BA_B may be stretched in the first direction X. The amount of stretching of the first bump area BA_P and the second bump area BA_B may be proportional to their initial lengths. The amount of stretching of the first bump area BA_P and the second bump area BA_B may be greater at the outer portions than at the central portion. For example, the first bump area BA_P and the second bump area BA_B may be stretched more toward the outer portion. In the first circuit board 200_7 according to the present embodiment, each of the first bump area BA_P and the second bump area BA_B may be divided into the plurality of portions to distribute the amount of stretching. Therefore, it is possible to increase the uniformity of the amount of stretching of the first bump area BA_P and the second bump area BA_B for each area. Accordingly, it is possible to minimize the alignment error between the first pad PE_P and the first bump BP_P and the alignment error between the second pad PE_B and the second bump BP_B.

Those skilled in the art will appreciate that many variations and modifications can be made to the embodiments described above without substantially departing from the principles of the present inventive concepts. Therefore, the disclosed embodiments of the inventive concepts are used in a generic and descriptive sense only and not for purposes of limitation.

What is claimed is:

1. A display device comprising:
 a display panel;
 a first circuit board attached to a first side of the display panel in a first direction; and
 a second circuit board attached to a second side of the first circuit board in the first direction,
 wherein the first circuit board includes a first bump area overlapping the display panel and a second bump area overlapping the second circuit board,
 wherein the first bump area includes a plurality of first divided board portions arranged along a second direction crossing the first direction, and
 wherein the first divided board portions of the plurality of first divided board portions partially overlap each other.

2. The display device of claim 1, wherein each of the first divided board portions includes a first base portion having a first thickness, and a first protrusion extending from the first base portion and having a second thickness smaller than the first thickness, and
 wherein the first protrusion includes a first overlapping protrusion Which overlaps a neighboring first divided board portion.

3. The display device of claim 2, wherein an edge of the first protrusion is disposed on the neighboring first divided board portion.

4. The display device of claim 2, wherein the first protrusion further includes a first non-overlapping protrusion which does not overlap the neighboring first divided board portion.

5. The display device of claim 1, wherein the second bump area includes a plurality of second divided board portions arranged along the second direction.

6. The display device of claim 5, wherein the second bump area further includes at least one second overlapping area in which the second divided board portions of the plurality of second divided board portions partially overlap each other.

7. The display device of claim 6, wherein each of the second divided board portions includes a second base portion having a first thickness, and a second protrusion extending from the second base portion and having a second thickness smaller than the first thickness, and
wherein the second protrusion includes a second overlapping protrusion which overlaps a neighboring second divided board portion.

8. The display device of claim 7, wherein an edge of the second protrusion is disposed on the neighboring second divided board portion.

9. The display device of claim 7, wherein the second protrusion further includes a second non-overlapping protrusion which does not overlap the neighboring second divided board portion.

10. The display device of claim 5, wherein the second bump area further includes at least one cutout area, and
wherein the second divided board portions are spaced apart from each other with the cutout area interposed therebetween.

11. The display device of claim 10, wherein the cutout area includes an elongated portion extending in the first direction and having a first width, and an enlarged portion disposed on a terminal side of the elongated portion in the first direction and having a second width greater than the first width.

12. A flexible printed circuit board comprising;
a board;
a plurality of first bumps disposed on a first side of the board in a first direction; and
a plurality of second bumps disposed on the opposite side of the board in the first direction,
wherein the board includes a first bump area in which the first bumps are disposed and a second bump area in which the second bumps are disposed,
wherein the first bump area includes a plurality of first divided board portions arranged along a second direction crossing the first direction, and
wherein the first divided board portions of the plurality of first divided board portions partially overlap each other.

13. The flexible printed circuit board of claim 12, wherein each of the first divided board portions includes a first base portion having a first thickness, and a first protrusion extending from the first base portion and having a second thickness smaller than the first thickness, and
the first protrusion includes a first overlapping protrusion which overlaps the neighboring first divided board portion.

14. The flexible printed circuit board of claim 13, wherein the first protrusion further includes a first non-overlapping protrusion which does not overlap the neighboring first divided board portion.

15. The flexible printed circuit board of claim 12, wherein the second bump area includes a plurality of second divided board portions arranged along the second direction.

16. The flexible printed circuit board of claim 15, wherein the second bump area further includes a second overlapping area in which the second divided board portions of the plurality of second divided board portions partially overlap each other.

17. The flexible printed circuit board of claim 16, wherein each of the second divided board portions includes a second base portion having a first thickness, and a second protrusion extending from the second base portion and having a second thickness smaller than the first thickness, and
wherein the second protrusion includes a second overlapping protrusion which overlaps the neighboring second divided board portion.

18. The flexible printed circuit board of claim 17, wherein the second protrusion further includes a second non-overlapping protrusion which does not overlap the neighboring second divided board portion.

19. The flexible printed circuit board of claim 15, wherein the second bump area further includes at least one cutout area, and
the second divided board portions are spaced apart from each other with the cutout area interposed therebetween.

20. The flexible printed circuit board of claim 19, wherein the cutout area includes an elongated portion extending in the first direction and having a first width, and an enlarged portion disposed on a terminal side of the elongated portion in the first direction and having a second width greater than the first width.

* * * * *